US010921938B2

(12) United States Patent
Wang et al.

(10) Patent No.: US 10,921,938 B2
(45) Date of Patent: Feb. 16, 2021

(54) CAPACITANCE DETECTING CIRCUIT, TOUCH DETECTING DEVICE AND TERMINAL DEVICE

(71) Applicant: SHENZHEN GOODIX TECHNOLOGY CO., LTD., Shenzhen (CN)

(72) Inventors: Zhengfeng Wang, Shenzhen (CN); Shuo Fan, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/420,146

(22) Filed: May 22, 2019

(65) Prior Publication Data
US 2019/0278401 A1 Sep. 12, 2019

Related U.S. Application Data

(63) Continuation of application No. PCT/CN2018/073914, filed on Jan. 24, 2018.

(51) Int. Cl.
*G06F 3/044* (2006.01)
*G06F 3/041* (2006.01)
*H03K 17/96* (2006.01)

(52) U.S. Cl.
CPC .......... *G06F 3/044* (2013.01); *G06F 3/0416* (2013.01); *H03K 17/962* (2013.01)

(58) Field of Classification Search
CPC ...... G06F 3/044; G06F 3/0418; G06F 3/0416; G06F 3/03547
See application file for complete search history.

(56) References Cited

U.S. PATENT DOCUMENTS

| 2010/0244859 | A1* | 9/2010 | Cormier, Jr. ............ G06F 3/044 324/678 |
| 2011/0050333 | A1 | 3/2011 | Zhu |
| 2011/0221399 | A1 | 9/2011 | Sawataishi et al. |
| 2012/0126906 | A1* | 5/2012 | Choe ...................... H03K 4/502 331/143 |
| 2012/0256869 | A1 | 10/2012 | Walsh et al. |
| 2014/0253491 | A1 | 9/2014 | Kwon et al. |

(Continued)

FOREIGN PATENT DOCUMENTS

| CN | 101281220 A | 10/2008 |
| CN | 101975893 A | 2/2011 |

(Continued)

*Primary Examiner* — Gerald Johnson

(57) ABSTRACT

A capacitance detecting circuit, includes a first front end circuit, a second front end circuit, a control circuit and a processing circuit, wherein the control circuit controls the first front end circuit and the second front end circuit such that the first front end circuit is configured to convert a capacitance signal of a detection capacitor into a first voltage signal through a first calibration capacitor, and the second front end circuit is configured to convert a capacitance signal of the detection capacitor into a second voltage signal through a second calibration capacitor; the processing circuit is calculates a differential signal of the first voltage signal and the second voltage signal to determine a capacitance variation of the detection capacitor according to the differential signal.

18 Claims, 7 Drawing Sheets

(56) References Cited

U.S. PATENT DOCUMENTS

| | | |
|---|---|---|
| 2015/0212650 A1 | 7/2015 | Noto et al. |
| 2018/0136761 A1 | 5/2018 | Jiang |
| 2018/0145665 A1* | 5/2018 | Hurwitz ................. H03K 4/502 |

FOREIGN PATENT DOCUMENTS

| | | |
|---|---|---|
| CN | 102221645 A | 10/2011 |
| CN | 103324366 A | 9/2013 |
| CN | 103376965 A | 10/2013 |
| CN | 103376967 A | 10/2013 |
| CN | 103475352 A | 12/2013 |
| CN | 104808880 A | 7/2015 |
| CN | 106537106 A | 3/2017 |
| CN | 106598370 A | 4/2017 |
| TW | 200910403 A | 3/2009 |

* cited by examiner

CAPACITANCE DETECTING CIRCUIT, TOUCH DETECTING DEVICE AND TERMINAL DEVICE

CROSS-REFERENCE TO RELATED APPLICATIONS

This application is a continuation of International Application No. PCT/CN2018/073914, filed on Jan. 24, 2018, the disclosure of which is hereby incorporated by reference in its entirety.

TECHNICAL FIELD

The present application relates to the technical field of electronics, and in particular, to a capacitance detecting circuit, a touch detecting device and a terminal device.

BACKGROUND

Capacitive sensors are widely applied in the field of human-machine interaction of electronic products. Specifically, a capacitor (or referred to as a base capacitor) is formed between a detection electrode and ground. When a conductor (such as a finger) approaches or touches the detection electrode, a capacitance between the detection electrode and the ground changes. By detecting a variation of the capacitance, information that the conductor approaches or touches the detection electrode is acquired, so as to determine user operation. The performance of a capacitance detecting circuit has a direct impact on user operation experience. Therefore, it is urgent to solve problems of improving an anti-interference ability of a capacitance detecting circuit and enhancing sensitivity of the capacitance detecting circuit.

SUMMARY

Embodiments of the present application provide a capacitance detecting circuit, a touch detecting device and a terminal device, which could improve an anti-interference ability of the capacitance detecting circuit and enhance sensitivity of the capacitance detecting circuit.

In a first aspect, provided is a capacitance detecting circuit, where the capacitance detecting circuit is configured to detect a capacitance variation of a detection capacitor with respect to a base capacitance value, the capacitance detecting circuit includes a first front end circuit, a second front end circuit, a control circuit and a processing circuit, and the control circuit is configured to control the first front end circuit and the second front end circuit such that the first front end circuit is configured to convert a capacitance signal of the detection capacitor into a first voltage signal under control of the control circuit, and the second front end circuit is configured to convert a capacitance signal of the detection capacitor into a second voltage signal under control of the control circuit;

where the first front end circuit includes a first calibration capacitor, a first charging and discharging circuit and a first integrating circuit, the detection capacitor is connected to the first charging and discharging circuit, and the first calibration capacitor is connected to the first charging and discharging circuit and a first input end of the first integrating circuit;

the first charging and discharging circuit is configured to perform charging and discharging on the detection capacitor connected to the first front end circuit and the first calibration capacitor, and the first integrating circuit is configured to convert the capacitance signal of the detection capacitor into the first voltage signal through the first calibration capacitor;

the second front end circuit includes a second calibration capacitor, a second charging and discharging circuit and a second integrating circuit, and the second calibration capacitor is connected to the second charging and discharging circuit and a first input end of the second integrating circuit;

the second charging and discharging circuit is configured to perform charging and discharging on the second calibration capacitor, and the second integrating circuit is configured to convert the capacitance signal of the detection capacitor into the second voltage signal through the second calibration capacitor; and the processing circuit is connected to output ends of the first integrating circuit and the second integrating circuit, and configured to calculate a differential signal of the first voltage signal output by the first integrating circuit and the second voltage signal output by the second integrating circuit, and determine the capacitance variation of the detection capacitor with respect to the base capacitance value according to the differential signal.

Therefore, the capacitance detecting circuit converts the capacitance signal of the detection capacitor into the first voltage signal and the second voltage signal respectively through the first front end circuit and the second front end circuit, and determines the capacitance variation of the detection capacitor with respect to the base capacitance value according to the differential signal of the first voltage signal and the second voltage signal. On one hand, since a signal weight contributed by the base capacitance value in the first voltage signal and the second voltage signal has been cancelled by the first calibration capacitor and the second calibration capacitor, the capacitance variation could be obtained according to the differential signal of the first voltage signal and the second voltage signal so as to improve the efficiency of capacitance detection. On the other hand, since differential processing is performed on the first voltage signal and the second voltage signal, interference of a noise signal could be eliminated to some extent, a signal-to-noise ratio and further an anti-interference ability of the capacitance detecting circuit are improved, and accordingly, sensitivity of the capacitance detecting circuit is enhanced.

Herein, that the first integrating circuit converts the capacitance signal of the detection capacitor into the first voltage signal is indirectly implemented by the first calibration capacitor. Charging and discharging time of the first calibration capacitor is equal to charging and discharging time of the detection capacitor, which is time during which the detection capacitor is discharged from a power supply voltage to a specific voltage or charged from zero to a specific voltage.

Optionally, in one possible implementation manner, the first charging and discharging circuit includes a first current source and a second current source, and the second charging and discharging circuit includes a third current source, where the first current source is connected to the detection capacitor for preforming charging or discharging on the detection capacitor, and the second current source is connected to the first calibration capacitor for performing charging or discharging on the first calibration capacitor, and a ratio of a capacitance value of the first calibration capacitor to the base capacitance value is equal to a ratio of a current value of the second current source to a current value of the first current source, and the third current source is connected to the second calibration capacitor for performing charging or discharging on the second calibration capacitor, and a ratio of a capacitance value of the second calibration capacitor to the base capacitance value is equal to a ratio of a current value of the third current source to the current value of the first current source.

Optionally, in one possible implementation manner, in an initialization phase, the control circuit is configured to control charges on the first integrating circuit and the second integrating circuit to be cleared;

in a first phase, the first charging and discharging circuit is configured to discharge the detection capacitor until a voltage of the detection capacitor is equal to zero, and discharge the first calibration capacitor until a voltage of the first calibration capacitor is equal to zero, and the second charging and discharging circuit is configured to charge the second calibration capacitor until a voltage of the second calibration capacitor is equal to a power supply voltage;

in a second phase, the first current source is configured to charge the detection capacitor until a voltage of the detection capacitor reaches a first voltage, the second current source is configured to charge the first calibration capacitor in a time period during which the first current source charges the detection capacitor, and the third current source is configured to discharge the second calibration capacitor to the third current source in a time period during which the first current source charges the detection capacitor;

in a third phase, the first integrating circuit is configured to convert a capacitance signal of the first calibration capacitor into the first voltage signal, and the second integrating circuit is configured to convert a capacitance signal of the second calibration capacitor into the second voltage signal, where an input voltage of a second input end of the first integrating circuit is equal to the first voltage, and an input voltage of a second input end of the second integrating circuit is equal to a second voltage.

Optionally, in one possible implementation manner, the first charging and discharging circuit includes a first switch, a second switch, a third switch and a fourth switch, the second charging and discharging circuit includes a fifth switch and a sixth switch, the first integrating circuit includes a seventh switch, and the second integrating circuit includes an eighth switch, where one end of the first switch is grounded and the other end is connected to a first end of the detection capacitor; one end of the second switch is connected to the first current source and the other end is connected to the first end of the detection capacitor; one end of the third switch is connected to the second current source and the other end is connected to a first end of the first calibration capacitor; one end of the fourth switch is grounded and the other end is connected to the first end of the first calibration capacitor; one end of the fifth switch is connected to a first end of the second calibration capacitor and the other end is connected to the third current source; one end of the sixth switch is connected to a power supply and the other end is connected to the first end of the second calibration capacitor; one end of the seventh switch is connected to the first end of the first calibration capacitor and the other end is connected to the first input end of the first integrating circuit; one end of the eighth switch is connected to the first end of the second calibration capacitor and the other end is connected to the first input end of the second integrating circuit; and a second end of the detection capacitor, a second end of the first calibration capacitor and a second end of the second calibration capacitor are all grounded.

Optionally, in one possible implementation manner, in the first phase, the first switch, the fourth switch and the sixth switch are turned on, and the second switch, the third switch, the fifth switch, the seventh switch and the eighth switch are turned off; in the second phase, the second switch, the third switch and the fifth switch are turned on, and the first switch, the fourth switch, the sixth switch, the seventh switch and the eighth switch are turned off; and in the third phase, the seventh switch and the eighth switch are turned on, and the first switch, the second switch, the third switch, the fourth switch, the fifth switch and the sixth switch are turned off.

Optionally, in one possible implementation manner, where the first voltage signal $V_{OUTP}$ output by the first integrating circuit and the second voltage signal $V_{OUTN}$ output by the second integrating circuit are respectively:

$$V_{OUTP} = V_{CM} - \frac{\Delta Cx(I_2/I_1)}{C_{S1}} V_{CM} N,$$

$$V_{OUTN} = V_{CM} + \frac{\Delta Cx(I_3/I_1)}{C_{S2}} V_{CM} N,$$

where $V_{R1}=V_{R2}=V_{DD}/2=V_{CM}$, $V_{R1}$ is a voltage value of the first voltage, $V_{R2}$ is a voltage value of the second voltage, $I_1$ is a current value of the first current source, $I_2$ is a current value of the second current source, $I_3$ is a current value of the third current source, $C_{S1}$ is a capacitance value of a first integrating capacitor, $C_{S2}$ is a capacitance value of a second integrating capacitor, $\Delta Cx$ is a capacitance variation of a capacitance value of the detection capacitor with respect to the base capacitance value, $V_{DD}$ is a power supply voltage, and N is a number of execution times from the first phase to the third phase, where N is a positive integer.

Optionally, in one possible implementation manner, in an initialization phase, the control circuit is configured to control charges on the first integrating circuit and the second integrating circuit to be cleared;

in a first phase, the first charging and discharging circuit is configured to charge the detection capacitor until a voltage of the detection capacitor is equal to a power supply voltage, and to charge the first calibration capacitor until a voltage of the first calibration capacitor is equal to the power supply voltage, and the second charging and discharging circuit is configured to discharge the second calibration capacitor until a voltage of the second calibration capacitor is equal to zero;

in a second phase, the first current source is configured to discharge the detection capacitor to the first current source until a voltage of the detection capacitor reaches a first voltage, the second current source is configured to discharge the first calibration capacitor to the second current source in a time period during which the detection capacitor discharges to the first current source, and the third current source is configured to charge the second calibration capacitor in a time period during which the detection capacitor discharges to the first current source; and in a third phase, the first integrating circuit is configured to convert a capacitance signal of the first calibration capacitor into the first voltage signal, and the second integrating circuit is configured to convert a capacitance signal of the second calibration capacitor into the second voltage signal, where an input voltage of a second input end of the first integrating circuit is equal to the first voltage, and an input voltage of a second input end of the second integrating circuit is equal to a second voltage.

Optionally, in one possible implementation manner, the first charging and discharging circuit includes a first switch, a second switch, a third switch and a fourth switch, the second charging and discharging circuit includes a fifth switch and a sixth switch, the first integrating circuit includes a seventh switch, and the second integrating circuit includes an eighth switch, where one end of the first switch is connected to a power supply and the other end is connected to a first end of the detection capacitor; one end of the second switch is connected to the first current source and the other end is connected to the first end of the detection capacitor; one end of the third switch is connected to the second current source and the other end is connected to a first end of the first calibration capacitor; one end of the fourth switch is connected to a power supply and the other end is connected to the first end of the first calibration capacitor; one end of the fifth switch is connected to a first end of the second calibration capacitor and the other end is connected to the third current source; one end of the sixth switch is grounded and the other end is connected to the first end of the second calibration capacitor; one end of the seventh switch is connected to the first end of the first calibration capacitor and the other end is connected to the first input end of the first integrating circuit; one end of the eighth switch is connected to the first end of the second calibration capacitor and the other end is connected to the first input end of the second integrating circuit; and a second end of the detection capacitor, a second end of the first calibration capacitor and a second end of the second calibration capacitor are all grounded.

Optionally, in one possible implementation manner, in the first phase, the first switch, the fourth switch and the sixth switch are turned on, and the second switch, the third switch, the fifth switch, the seventh switch and the eighth switch are turned off; in the second phase, the second switch, the third switch and the fifth switch are turned on, and the first switch, the fourth switch, the sixth switch, the seventh switch and the eighth switch are turned off; and in the third phase, the seventh switch and the eighth switch are turned on, and the first switch, the second switch, the third switch, the fourth switch, the fifth switch and the sixth switch are turned off.

Optionally, in one possible implementation manner, where the first voltage signal $V_{OUTP}$ output by the first integrating circuit and the second voltage signal $V_{OUTN}$ output by the second integrating circuit are respectively:

$$V_{OUTP} = V_{CM} + \frac{\Delta Cx(I_2/I_1)}{C_{S1}} V_{CM} N,$$

$$V_{OUTN} = V_{CM} - \frac{\Delta Cx(I_3/I_1)}{C_{S2}} V_{CM} N,$$

where $V_{R1}=V_{R2}=V_{DD}/2=V_{CM}$, $V_{R1}$ is a voltage value of the first voltage, $V_{R2}$ is a voltage value of the second voltage, $I_1$ is a current value of the first current source, $I_2$ is a current value of the second current source, $I_3$ is a current value of the third current source, $C_{S1}$ is a capacitance value of a first integrating capacitor, $C_{S2}$ is a capacitance value of a second integrating capacitor, $\Delta Cx$ is a capacitance variation of a capacitance value of the detection capacitor with respect to the base capacitance value, $V_{DD}$ is a power supply voltage, and N is a number of execution times from the first phase to the third phase, where N is a positive integer.

Optionally, in one possible implementation manner, the capacitance detecting circuit further includes a comparator, a first input end of the comparator is connected to the detection capacitor, an output end of the comparator is connected to the control circuit, and a second input end of the comparator is configured to input the first voltage in the second phase, and when the comparator determines that the voltage of the detection capacitor reaches the first voltage in the second phase, the control circuit controls the first charging and discharging circuit to stop performing charging and discharging on the detection capacitor and the first calibration capacitor and controls the second charging and discharging circuit to stop performing charging and discharging on the second calibration capacitor.

Optionally, in one possible implementation manner, the first charging and discharging circuit includes a first current source, a second current source and a fourth current source, and the second charging and discharging circuit includes a third current source, where the first current source and the fourth current source are both connected to the detection capacitor, the first current source is configured to charge the detection capacitor, and the fourth current source is configured to discharge the detection capacitor, the second current source is connected to the first calibration capacitor for charging the first calibration capacitor, and a ratio of a capacitance value of the first calibration capacitor to the base capacitance value is equal to a ratio of a current value of the second current source to a current value of the first current source, and the third current source is connected to the second calibration capacitor for discharging the second calibration capacitor, and a ratio of a capacitance value of the second calibration capacitor to the base capacitance value is equal to a ratio of a current value of the third current source to a current value of the fourth current source.

Optionally, in one possible implementation manner, in an initialization phase, the control circuit is configured to control charges on the first integrating circuit and the second integrating circuit to be cleared, and the first charging and discharging circuit is configured to clear charges on the first calibration capacitor and the detection capacitor;

in a first phase, the first current source is configured to charge the detection capacitor until a voltage of the detection capacitor reaches a first voltage, and the second current source is configured to charge the first calibration capacitor in a time period during which the first current source charges the detection capacitor;

in a second phase, the first integrating circuit is configured to convert a capacitance signal of the first calibration capacitor into the first voltage signal, the first charging and discharging circuit is configured to charge the detection capacitor until a voltage of the detection capacitor is equal to a power supply voltage, and the second charging and discharging circuit is configured to charge the second calibration capacitor until a voltage of the second calibration capacitor is equal to a power supply voltage, where an input voltage of a second input end of the first integrating circuit is equal to the first voltage;

in a third phase, the fourth current source is configured to discharge the detection capacitor to the fourth current source until a voltage of the detection capacitor reaches a second voltage, and the third current source is configured to discharge the second calibration capacitor to the third current source in a time period during which the detection capacitor discharges to the fourth current source; and in a fourth phase, the second integrating circuit is configured to convert a capacitance signal of the second calibration capacitor into the second voltage signal, and the first charging and discharging circuit is configured to discharge the detection capacitor until a voltage of the detection capacitor is equal to zero, and discharge the first calibration capacitor until a voltage of the first calibration capacitor is equal to zero, where an input voltage of a second input end of the second integrating circuit is equal to the second voltage.

Optionally, in one possible implementation manner, the first charging and discharging circuit includes a first switch, a second switch, a third switch, a fourth switch, a ninth switch and a tenth switch, the second charging and discharging circuit includes a fifth switch and a sixth switch, the first integrating circuit includes a seventh switch, and the second integrating circuit includes an eighth switch, where one end of the first switch is grounded and the other end is connected to a first end of the detection capacitor; one end of the second switch is connected to the first current source and the other end is connected to the first end of the detection capacitor; one end of the third switch is connected to the second current source and the other end is connected to a first end of the first calibration capacitor; one end of the fourth switch is grounded and the other end is connected to the first end of the first calibration capacitor; one end of the ninth switch is connected to the fourth current source and the other end is connected to the first end of the detection capacitor; one end of the tenth switch is connected to a power supply and the other end is connected to the first end of the detection capacitor; one end of the fifth switch is connected to a first end of the second calibration capacitor and the other end is connected to the third current source; one end of the sixth switch is connected to a power supply and the other end is connected to the first end of the second calibration capacitor; one end of the seventh switch is connected to the first end of the first calibration capacitor and the other end is connected to the first input end of the first integrating circuit; one end of the eighth switch is connected to the first end of the second calibration capacitor and the other end is connected to the first input end of the second integrating circuit; and a second end of the detection capacitor, a second end of the first calibration capacitor and a second end of the second calibration capacitor are all grounded.

Optionally, in one possible implementation manner, in the first phase, the second switch and the third switch are turned on, and the first switch, the fourth switch, the fifth switch, the sixth switch, the seventh switch, the eighth switch, the ninth switch and the tenth switch are turned off; in the second phase, the sixth switch, the seventh switch and the tenth switch are turned on, and the first switch, the second switch, the third switch, the fourth switch, the fifth switch, the eighth switch and the ninth switch are turned off; in the third phase, the fifth switch and the ninth switch are turned on, and the first switch, the second switch, the third switch, the fourth switch, the sixth switch, the seventh switch, the eighth switch and the tenth switch are turned off; and in the fourth phase, the first switch, the fourth switch and the eighth switch are turned on, and the second switch, the third switch, the fifth switch, the sixth switch, the seventh switch, the ninth switch and the tenth switch are turned off.

Optionally, in one possible implementation manner, where the first voltage signal $V_{OUTP}$ output by the first integrating circuit and the second voltage signal $V_{OUTN}$ output by the second integrating circuit are respectively:

$$V_{OUTP} = V_{R1} - \frac{\Delta Cx(I_2/I_1)}{C_{S1}} V_{R1}(N/2),$$

$$V_{OUTN} = V_{R2} + \frac{\Delta Cx(I_3/I_4)}{C_{S2}} (V_{DD} - V_{R2})(N/2),$$

where $V_{R1}$ is a voltage value of the first voltage, $V_{R2}$ is a voltage value of the second voltage, $V_{DD}$ is a power supply voltage, $I_1$ is a current value of the first current source, $I_2$ is a current value of the second current source, $I_3$ is a current value of the third current source, $I_4$ is a current value of the fourth current source, $C_{S1}$ is a capacitance value of a first integrating capacitor, $C_{S2}$ is a capacitance value of a second integrating capacitor, $\Delta Cx$ is a capacitance variation of a capacitance value of the detection capacitor with respect to the base capacitance value, and N is a number of execution times from the first phase to the third phase, where N is an even number.

In a second aspect, an embodiment of the present application provides a touch detecting device, including: the capacitance detecting circuit according to the first aspect or any one of optional implementation manners of the first aspect, where the touch detecting device determines a touch position of a user according to a capacitance variation of a detection capacitor with respect to a base capacitance value that is determined by the capacitance detecting circuit.

In a third aspect, an embodiment of the present application provides a terminal device, including: the touch detecting device according to the second aspect.

DESCRIPTION OF EMBODIMENTS

The technical solutions in embodiments of the present application will be described hereinafter in conjunction with the accompanying drawings.

For ease of understanding, a schematic diagram of one possible application scenario of a capacitance detecting circuit in an embodiment of the present application is described below with reference to FIG. 1.

Figure 1:
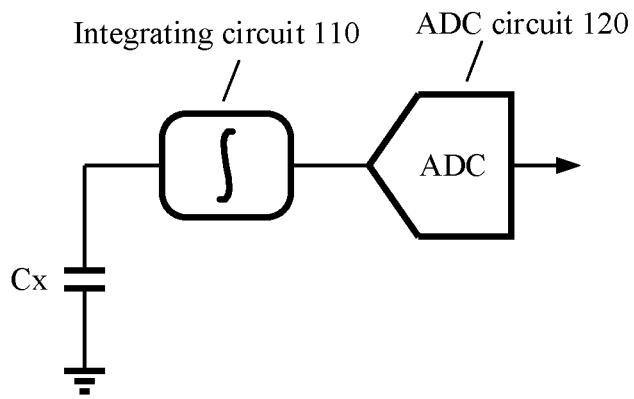
FIG. 1 is a schematic circuit diagram of a conventional capacitance detecting circuit.

FIG. 1 shows a common capacitance detecting circuit 100 including an integrating circuit 110 and an analog to digital converter (Analog to Digital Converter, ADC) circuit 120 connected to the integrating circuit 110. A detection capacitor (or referred to as a capacitor to be detected) $C_x$ has one end grounded and the other end connected to an input end of the integrating circuit 110. The integrating circuit 110 converts a capacitance signal of the detection capacitor $C_x$ into a voltage signal, and outputs the voltage signal to the ADC circuit 120, and the ADC circuit 120 converts the voltage signal into a digital signal, thereby completing capacitance detection. When no finger touches or approaches a detection electrode corresponding to the detection capacitor, a capacitance value of the capacitor $C_x$ is equal to a base capacitance value $C_{x0}$ (that is, a capacitance value when an operation is not performed). When a finger approaches or touches the detection electrode corresponding to the detection capacitor, a capacitance value of the capacitor $C_x$ detected by the capacitance detecting circuit 100 changes, for example, to be $C_{x0}+\Delta C_x$. Therefore, according to the detected capacitance variation $\Delta C_x$ of the detection capacitor, information that a finger approaches or touches the detection electrode could be acquired.

Embodiments of the present application provide a capacitance detecting circuit including two front end circuits for converting a capacitance signal of a detection capacitor into two voltage signals through corresponding connected calibration capacitors respectively. According to a differential signal obtained by performing differential processing on the two voltage signals, a capacitance variation of the detection capacitor associated with the two calibration capacitors with respect to a base capacitance value is determined, thereby effectively improving an anti-interference ability of the capacitance detecting circuit and a signal-to-noise ratio, enhancing sensitivity of the capacitance detecting circuit, and further promoting user experience.

It should be understood that the capacitance detecting circuit of the embodiments of the present application can be applied to any scenario, in particular, to a touch detecting device for detecting touch information of a user.

Hereinafter, a capacitance detecting circuit according to an embodiment of the present application will be described in detail with reference to FIGS. 2 to 8.

Figure 2:
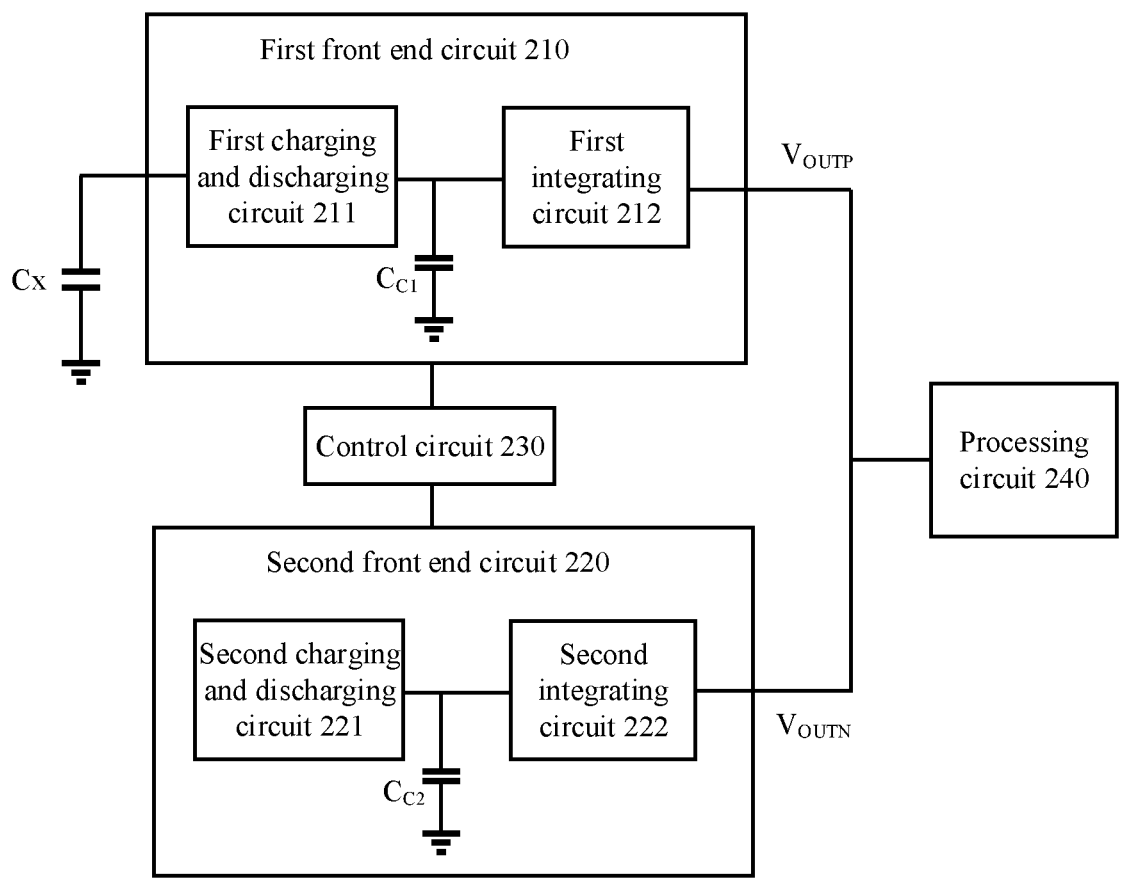
FIG. 2 is a schematic circuit diagram of a capacitance detecting circuit according to an embodiment of the present application.

FIG. 2 is a schematic structural diagram of a capacitance detecting circuit 200 according to an embodiment of the present application.

As shown in FIG. 2, the capacitance detecting circuit 200 is configured to detect a capacitance variation $\Delta_{Cx}$ of a detection capacitor with respect to a base capacitance value $C_{x0}$, the capacitance detecting circuit includes a first front end circuit 210, a second front end circuit 220, a control circuit 230 and a processing circuit 240, and the control circuit 230 is configured to control the first front end circuit 210 and the second front end circuit 220 such that the first front end circuit 210 is configured to convert a capacitance signal of the detection capacitor into a first voltage signal $V_{OUTP}$ under control of the control circuit 230, and the second front end circuit is configured to convert a capacitance signal of the detection capacitor into a second voltage signal $V_{OUTN}$ under control of the control circuit 230.

The first front end circuit 210 includes a first calibration capacitor $C_{C1}$, a first charging and discharging circuit 211 and a first integrating circuit 212, the detection capacitor is connected to the first charging and discharging circuit 211, and the first calibration capacitor $C_{C1}$ is connected to the first charging and discharging circuit 211 and a first input end of the first integrating circuit 212.

The first charging and discharging circuit 211 is configured to perform charging and discharging on the detection capacitor connected to the first front end circuit 210 and the first calibration capacitor $C_{C1}$, and the first integrating circuit 212 is configured to convert the capacitance signal of the detection capacitor into the first voltage signal $V_{OUTP}$ through the first calibration capacitor $C_{C1}$.

The second front end circuit 220 includes a second calibration capacitor $C_{C2}$, a second charging and discharging circuit 221 and a second integrating circuit 222, and the second calibration capacitor $C_{C2}$ is connected to the second charging and discharging circuit 221 and a first input end of the second integrating circuit 222.

The second charging and discharging circuit 221 is configured to perform charging and discharging on the second calibration capacitor $C_{C2}$, and the second integrating circuit 222 is configured to convert the capacitance signal of the detection capacitor into the second voltage signal $V_{OUTN}$ through the second calibration capacitor $C_{C2}$.

The processing circuit 240 is connected to output ends of the first integrating circuit 212 and the second integrating circuit 222, and configured to calculate a differential signal of the first voltage signal $V_{OUTP}$ output by the first integrating circuit 212 and the second voltage signal $V_{OUTN}$ output by the second integrating circuit 222, and determine the capacitance variation of the detection capacitor with respect to the base capacitance value according to the differential signal.

In the embodiment of the present application, the capacitance detecting circuit converts the capacitance signal of the detection capacitor into the first voltage signal and the second voltage signal respectively through the first front end circuit and the second front end circuit, and determines the capacitance variation of the detection capacitor with respect to the base capacitance value according to the differential signal of the first voltage signal and the second voltage signal. On one hand, since a signal weight contributed by the base capacitance value in the first voltage signal and the second voltage signal has been cancelled by the first calibration capacitor and the second calibration capacitor, the capacitance variation could be obtained according to the differential signal of the first voltage signal and the second voltage signal so as to improve the efficiency of capacitance detection. On the other hand, since differential processing is performed on the first voltage signal and the second voltage signal, interference of a noise signal could be eliminated to some extent, a signal-to-noise ratio and further an anti-interference ability of the capacitance detecting circuit are improved, and accordingly, sensitivity of the capacitance detecting circuit is enhanced.

It should be understood, that the first integrating circuit 212 converts the capacitance signal of the detection capacitor into the first voltage signal $V_{OUTP}$ is indirectly implemented by the first calibration capacitor $C_{C1}$. A capacitance variation of the first calibration capacitor is related to charging and discharging time of the detection capacitor $C_X$. Specifically, charging and discharging time of the first calibration capacitor $C_{C1}$ is equal to charging and discharging time of the detection capacitor $C_X$. For example, time during which the first calibration capacitor $C_{C1}$ is charged from zero to the end or time during which the first calibration capacitor $C_{C1}$ is discharged from a power supply voltage $V_{DD}$ to the end is equal to time during which the detection capacitor $C_X$ is charged from zero to a specific voltage or time during which the detection capacitor $C_X$ is discharged from a power supply voltage $V_{DD}$ to a specific voltage. Therefore, a charging and discharging process of the detection capacitor $C_X$ is associated with a charging and discharging process of the first calibration capacitor $C_{C1}$ by controlling the charging and discharging time of the detection capacitor $C_X$, so that the first integrating circuit 212 implements conversion of the capacitance signal of the detection capacitor $C_X$ into the first voltage signal $V_{OUTP}$ indirectly by performing integration processing on the first calibration capacitor $C_{C1}$.

Similarly, time during which the second calibration capacitor $C_{C2}$ is charged from zero to the end or time during which the second calibration capacitor $C_{C2}$ is discharged from a power supply voltage $V_{DD}$ to the end is equal to time during which the detection capacitor $C_X$ is charged from zero to a specific voltage or time during which the detection capacitor $C_X$ is discharged from a power supply voltage $V_{DD}$ to a specific voltage. Therefore, a charging and discharging process of the detection capacitor $C_X$ is associated with a charging and discharging process of the second calibration capacitor $C_{C2}$ by controlling the charging and discharging time of the detection capacitor $C_X$, so that the second integrating circuit 222 implements conversion of the capacitance signal of the detection capacitor $C_X$ into the second voltage signal $V_{OUTN}$ indirectly by performing integration processing on the second calibration capacitor $C_{C2}$.

Optionally, the first integrating circuit 212 includes a first operational amplifier (Operational Amplifier, OP) 1 and a first integrating capacitor $C_{S1}$ connected in parallel with the first operational amplifier, that is, the first integrating capacitor $C_{S1}$ is connected across an input end and an output end of the first operational amplifier. The second integrating circuit 222 includes a second operational amplifier OP2 and a second integrating capacitor $C_{S2}$ connected in parallel with the second operational amplifier.

Optionally, the processing circuit 240 includes an analog to digital conversion (Analog-to-Digital Conversion, ADC) circuit, and the analog to digital conversion circuit is connected to output ends of the first integrating circuit 212 and the second integrating circuit 222. The analog to digital conversion circuit is configured to convert the first voltage signal $V_{OUTP}$ output by the first integrating circuit 212 into a digital signal, and convert the second voltage signal $V_{OUTN}$ output by the second integrating circuit 222 into a digital signal. Thereby, the processing circuit 240 can determine the capacitance variation $\Delta C_x$ of the detection capacitor $C_X$ according to the digitized first voltage signal $V_{OUTP}$ and the digitized second voltage signal $V_{OUTN}$.

The capacitance detecting circuit 200 of the embodiment of the present application can be specifically implemented by the following two types of circuit structures, which are respectively described below with reference to FIGS. 3 to 8. It should be understood that examples shown in FIGS. 3 to 8 are for helping those skilled in the art better understand embodiments of the present application, rather than for limiting the scope of the embodiments of the present application. It will be obvious for those skilled in the art to make various equivalent modifications or variations according to FIGS. 3 to 8 as illustrated, which also fall within the scope of the embodiments of the present application.

Type 1

Figure 3:
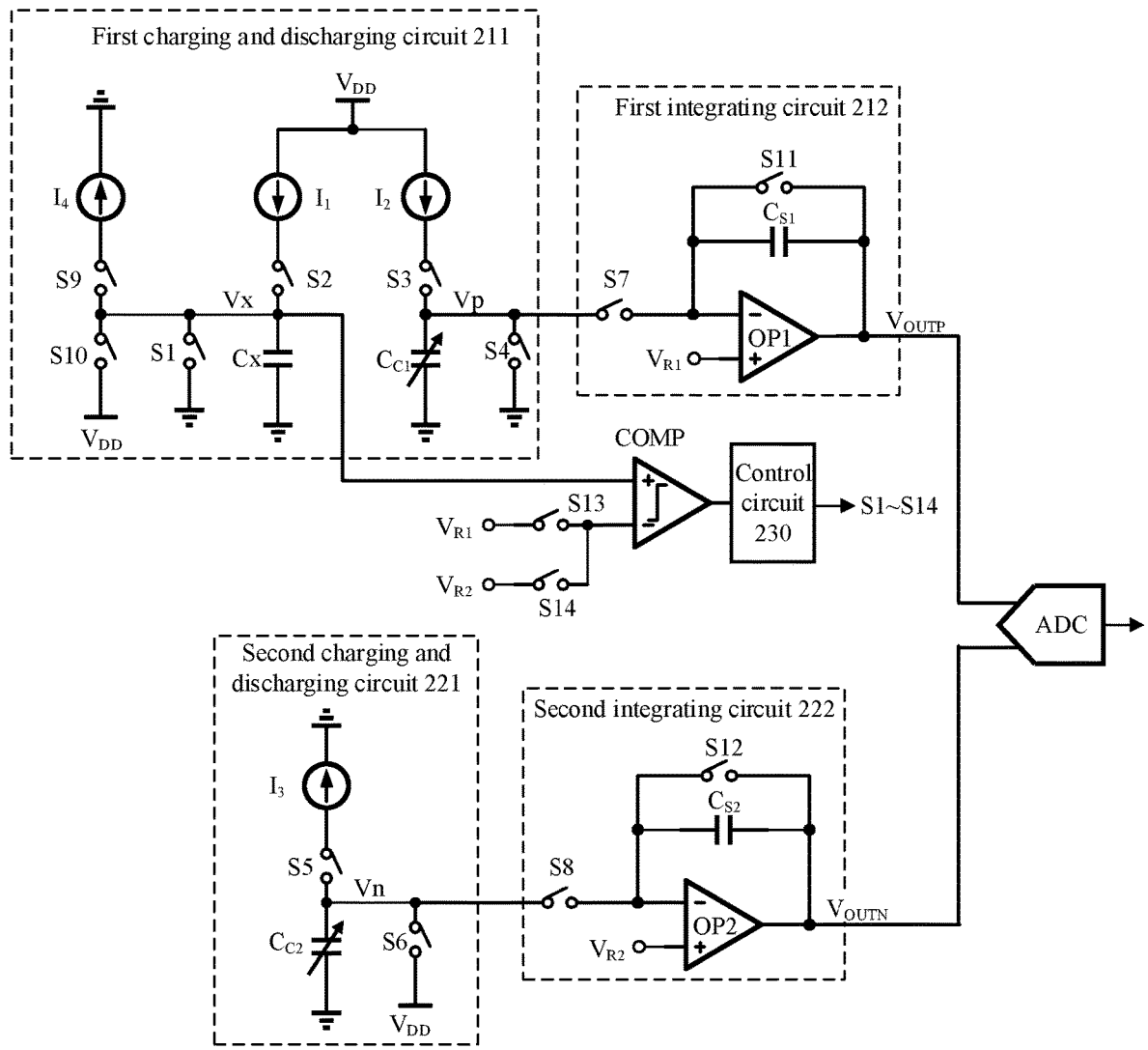
FIG. 3 is a schematic circuit diagram of a capacitance detecting circuit according to an embodiment of the present application.

Referring to FIG. 3, optionally, the first charging and discharging circuit 211 includes a first current source $I_1$, a fourth current source $I_4$ and a second current source $I_2$, and the second charging and discharging circuit 221 includes a third current source $I_3$.

The first current source $I_1$ and the fourth current source $I_4$ are both connected to the detection capacitor $C_X$, the first current source $I_1$ is configured to charge the detection capacitor $C_X$, and the fourth current source $I_4$ is configured to discharge the detection capacitor $C_X$, the second current source $I_2$ is connected to the first calibration capacitor $C_{C1}$ for charging the first calibration capacitor $C_{C1}$, and a ratio of a capacitance value of the first calibration capacitor $C_{C1}$ to the base capacitance value $C_{X0}$ is equal to a ratio of a current value of the second current source $I_2$ to a current value of the first current source $I_1$, that is, $C_{C1}/C_{X0}=I_2/I_1$.

The third current source $I_3$ is connected to the second calibration capacitor $C_{C2}$ for discharging the second calibration capacitor $C_{C2}$, and a ratio of a capacitance value of the second calibration capacitor $C_{C2}$ to the base capacitance value $C_{X0}$ is equal to a ratio of a current value of the third current source $I_3$ to a current value of the fourth current source $I_4$, that is, $C_{C2}/C_{X0}=I_3/I_4$.

In an initialization phase, the control circuit 230 is configured to control charges on the first integrating circuit 212 and the second integrating circuit 222 to be cleared, and the first charging and discharging circuit 211 is configured to clear charges on the first calibration capacitor $C_{C1}$ and the detection capacitor $C_X$.

In a first phase, the first current source $I_1$ is configured to charge the detection capacitor $C_X$ until a voltage of the detection capacitor $C_X$ reaches a first voltage $V_{R1}$, and the second current source $I_2$ is configured to charge the first calibration capacitor $C_{C1}$ in a time period $t_{charge}$ charge during which the first current source $I_1$ charges the detection capacitor $C_X$.

In a second phase, the first integrating circuit 212 is configured to convert a capacitance signal of the first calibration capacitor $C_{C1}$ into the first voltage signal $V_{OUTP}$, the first charging and discharging circuit 211 is configured to charge the detection capacitor $C_X$ until a voltage of the detection capacitor $C_X$ is equal to the power supply voltage $V_{DD}$, and the second charging and discharging circuit 221 is configured to charge the second calibration capacitor $C_{C2}$ until a voltage of the second calibration capacitor $C_{C2}$ is equal to a power supply voltage $V_{DD}$, where an input voltage of a second input end of the first integrating circuit 212 is equal to the first voltage $V_{R1}$ in the second phase.

In a third phase, the fourth current source $I_4$ is configured to discharge the detection capacitor $C_X$ to the fourth current source $I_4$ until a voltage of the detection capacitor $C_X$ reaches a second voltage $V_{R2}$, and the third current source $I_3$ is configured to discharge the second calibration capacitor $C_{C2}$ to the third current source $I_3$ in a time period $t_{discharge}$ during which the detection capacitor $C_X$ discharges to the fourth current source $I_4$.

In a fourth phase, the second integrating circuit 222 is configured to convert a capacitance signal of the second calibration capacitor $C_{C2}$ into the second voltage signal $V_{OUTN}$, and the first charging and discharging circuit 211 is configured to discharge the detection capacitor $C_X$ until a voltage of the detection capacitor $C_X$ is equal to zero, and discharge the first calibration capacitor $C_{C1}$ until a voltage of the first calibration capacitor $C_{C1}$ is equal to zero, where an input voltage of a second input end of the second integrating circuit is equal to the second voltage $V_{R2}$ in the fourth phase.

Optionally, the capacitance detecting circuit further includes a comparator COMP. A first input end of the comparator, for example, a non-inverting input end, is connected to the detection capacitor $C_X$, an output end of the comparator is connected to the control circuit 230, and a second input end of the comparator, for example, an inverting input end, is configured to input the first voltage $V_{R1}$ in the first phase, and input the second voltage $V_{R2}$ in the third phase.

When the comparator determines that the voltage of the detection capacitor $C_X$ reaches the first voltage $V_{R1}$ in the first phase or the voltage of the detection capacitor $C_X$ reaches the second voltage $V_{R2}$ in the third phase, the control circuit 230 controls the first charging and discharging circuit 211 to stop performing charging and discharging on the detection capacitor $C_X$ and the first calibration capacitor $C_{C1}$ and controls the second charging and discharging circuit 221 to stop performing charging and discharging on the second calibration capacitor $C_{C2}$.

Description is made below by the example of FIG. 3. On the basis of the foregoing illustration of the circuit structure of FIG. 3, the capacitance detecting circuit further includes a switch set for controlling each of the capacitors to enter into a different phase or enter into a charging/discharging phase. For example, the first charging and discharging circuit 211 further includes a first switch S1, a second switch S2, a third switch S3, a fourth switch S4, a ninth switch S9 and a tenth switch S10, the second charging and discharging circuit 221 includes a fifth switch S5 and a sixth switch S6, the first integrating circuit 212 includes a seventh switch S7 and an eleventh switch S11, and the second integrating circuit includes an eighth switch S8 and a twelfth switch S12, and the comparator includes a thirteenth switch S13 and a fourteenth switch S14.

One end of S1 is grounded and the other end is connected to a first end of the detection capacitor $C_X$; one end of S2 is connected to the first current source $I_1$ and the other end is connected to the first end of the detection capacitor $C_X$; one end of S3 is connected to the second current source $I_2$ and the other end is connected to a first end of the first calibration capacitor $C_{C1}$; one end of S4 is grounded and the other end is connected to the first end of the first calibration capacitor $C_{C1}$; one end of S9 is connected to the fourth current source $I_4$ and the other end is connected to the first end of the detection capacitor $C_X$; one end of S10 is connected to a power supply and the other end is connected to the first end of the detection capacitor $C_X$; one end of S5 is connected to a first end of the second calibration capacitor $C_{C2}$ and the other end is connected to the third current source $I_3$; one end of S6 is connected to a power supply and the other end is connected to the first end of the second calibration capacitor $C_{C2}$; one end of S7 is connected to the first end of the first calibration capacitor $C_{C1}$ and the other end is connected to a first input end of the first integrating circuit 212; S11 is connected in parallel with a first integrating capacitor $C_{S1}$; one end of S8 is connected to the first end of the second calibration capacitor $C_{C2}$ and the other end is connected to a first input end of the second integrating circuit 222; S12 is connected in parallel with a second integrating capacitor $C_{S2}$; one end of S13 is connected to the second input end of the comparator, and the other end is at a voltage equal to the first voltage $V_{R1}$; and one end of S14 is connected to the second input end of the comparator, and the other end is at a voltage equal to the second voltage $V_{R2}$. A second end of the detection capacitor $C_X$, a second end of the first calibration capacitor $C_{C1}$ and a second end of the second calibration capacitor $C_{C2}$ are all grounded.

Magnitudes of the first voltage $V_{R1}$ and the second voltage $V_{R2}$ are not limited in the embodiments of the present application. Description is made below by only taking $V_{R1} > V_{R2}$ as an example.

Figure 4:
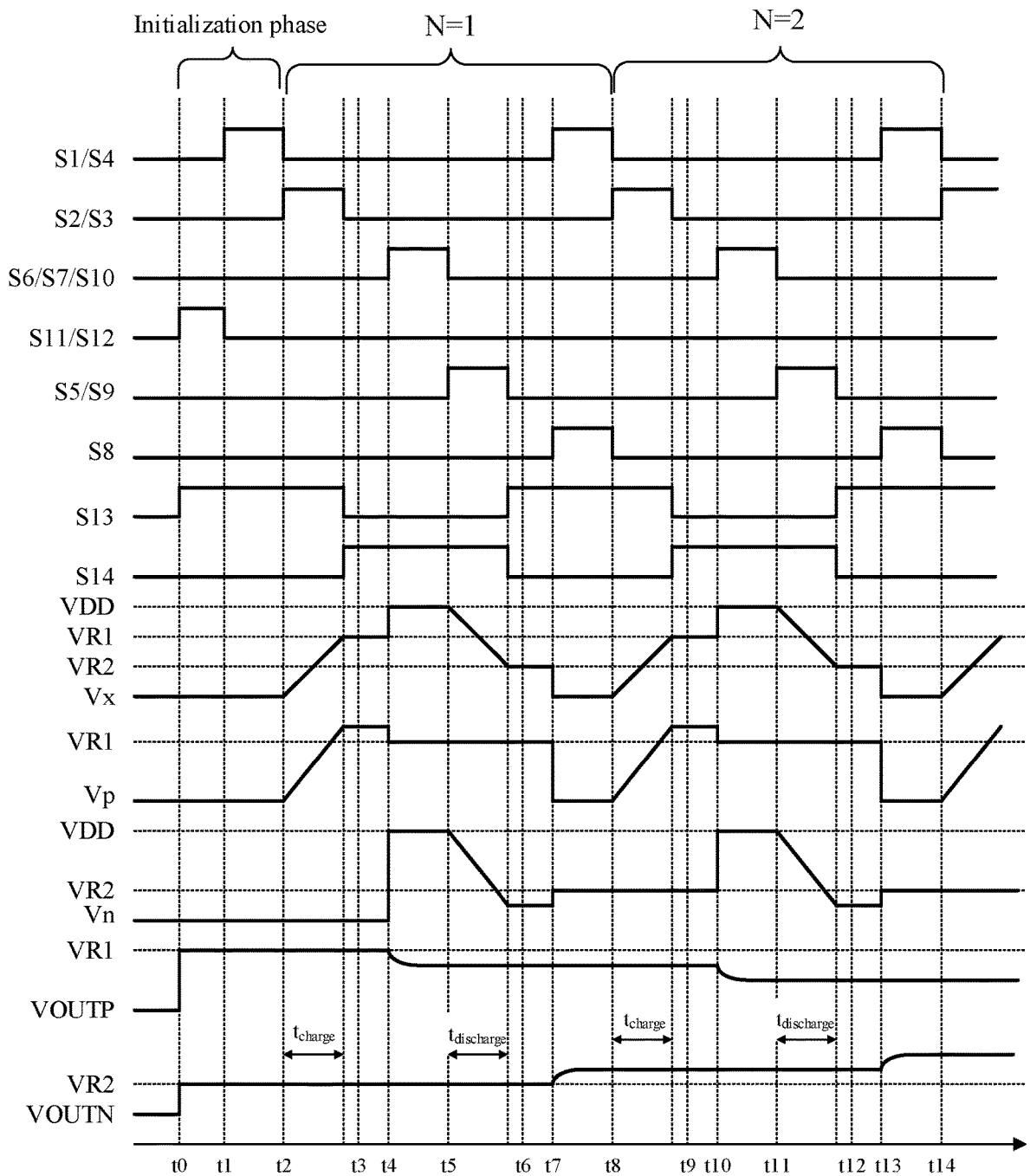
FIG. 4 is a logic timing diagram of a capacitance detecting circuit according to an embodiment of the present application.

In the initialization phase, for example, a phase t0 to t1 shown in FIG. 4, the control circuit 230 may control S11~S13 to be turned on and S1~S10 to be turned off, so that a first integrating capacitor $C_{S1}$ and a second integrating capacitor $C_{S2}$ are completely discharged, that is, until voltages of the first integrating capacitor $C_{S1}$ and the second integrating capacitor $C_{S2}$ are equal to zero. At the same time, an inverting input end of the comparator is connected to the voltage $V_{R1}$. At this time, the quantities of charges stored on the first integrating capacitor $C_{S1}$ and the second integrating capacitor $C_{S2}$ are zero, the first voltage signal $V_{OUTP}$ output by the first integrating circuit 212 is equal to $V_{R1}$, and the second voltage signal $V_{OUTN}$ output by the second integrating circuit 222 is equal to $V_{R2}$. When the quantities of charges stored on the first integrating capacitor $C_{S1}$ and the second integrating capacitor $C_{S2}$ reach an upper limit, S11 and S12 may be re-controlled to be turned on so as to clear the charges stored on the first integrating capacitor $C_{S1}$ and the second integrating capacitor $C_{S2}$.

In the initialization phase, for example, a phase t1 to t2 shown in FIG. 4, the control circuit 230 may further control the switches S1, S4 and S13 to be turned on and the switches S2, S3, S5~S12 and S14 to be turned off, so that the detection capacitor $C_X$ and the first calibration capacitor $C_{C1}$ are completely discharged, that is, until voltages of the detection capacitor $C_X$ and the first calibration capacitor $C_{C1}$ are equal to zero. At time t2, the quantities of charges stored on the detection capacitor $C_X$ and the first calibration capacitor $C_{C1}$ are zero, the first voltage signal $V_{OUTP}$ output by the first integrating circuit 212 is equal to $V_{R1}$, and the second voltage signal $V_{OUTN}$ output by the second integrating circuit 222 is equal to $V_{R2}$.

Next, the control circuit 230 may control the switching state of the above switches, that is, on or off, thereby implementing operations from the first phase to the third phase. A working process of the capacitance detecting circuit is specifically illustrated below by taking switching states shown in Table 1 and a logic timing diagram shown in FIG. 4 as an example.

TABLE 1

| First Phase | OFF | S1, S4~S12, S14 |
|---|---|---|
| | ON | S2, S3, S13 |
| Buffer Phase | | S1~S13 are turned off, and S14 is turned on |
| Second Phase | OFF | S1~S5, S8~S9, S11~S13 |
| | ON | S6, S7, S10, S14 |
| Third Phase | OFF | S1~S4, S6~S8, S10~S13 |
| | ON | S5, S9, S14 |
| Buffer Phase | | S1~S12 and S14 are turned off, and S13 is turned on |
| Fourth Phase | OFF | S2~S3, S5~S7, S9~S12, S14 |
| | ON | S1, S4, S8, S13 |

In the first phase, for example, a phase t2 to t3 shown in FIG. 4, the control circuit 230 may control the switches S1, S4~S12 and S14 to be turned off, and the switches S2, S3 and S13 to be turned on. Thereby, the first current source $I_1$ charges the detection capacitor $C_X$, and the second current source $I_2$ charges the first calibration capacitor $C_{C1}$ until the voltage of the detection capacitor $C_X$ reaches the first voltage $V_{R1}$. It should be noted that a duration during which the first current source $I_1$ charges the detection capacitor $C_X$ is equal to a duration during which the second current source $I_2$ charges the first calibration capacitor $C_{C1}$. In other words, charging of the detection capacitor $C_X$ by the first current source $I_1$ is performed simultaneously with charging of the first calibration capacitor $C_{C1}$ by the second current source $I_2$.

Since the non-inverting input end of the comparator is connected to the detection capacitor $C_X$, and an input voltage of the inverting input end thereof is equal to the first voltage $V_{R1}$, a signal output by an output end of the comparator to the control circuit 230 is reversed when the voltage of the detection capacitor $C_X$ reaches the first voltage $V_{R1}$, so that the control circuit 230 knows when the detection capacitor $C_X$ is charged to a voltage equal to the first voltage $V_{R1}$, and controls the switches S2, S3 and S13 to be turned off and the switch S14 to be turned on when the voltage of the detection capacitor $C_X$ reaches the first voltage $V_{R1}$, so that the input voltage of the inverting input end of the comparator is equal to the second voltage $V_{R2}$.

In the embodiment of the present application, the non-inverting input end and the inverting input end of the comparator may be exchanged, as long as the control module can detect that the signal output by the comparator is reversed.

The length of the time period $t_{charge}$ during which the first current source $I_1$ charges the detection capacitor $C_X$ until the voltage of the detection capacitor $C_X$ reaches the first voltage $V_{R1}$ is as follows:

$$t_{charge} = \frac{V_{R1} C_X}{I_1}, \quad \text{Equation (1)}$$

where $C_X$ is a capacitance value of the detection capacitor $C_X$, and $I_1$ is a current value of the first current source $I_1$.

At time t3, the quantity of charges stored on the first calibration capacitor $C_{C1}$ is as follows:

$$Q_{C_{C1}, t2 \sim t3} = I_2 t_{charge} = \frac{I_2 V_{R1} C_X}{I_1}, \quad \text{Equation (2)}$$

where $t_{charge}$ shall satisfy a condition $t_{charge} \leq t3-t2$. $I_2$ is a current value of the second current source $I_2$.

Optionally, in order to avoid charge leakage caused by frequent switching of a switch, a buffer phase may be further included after the first phase, for example, t3 to t4 shown in FIG. 4. In the buffer phase, the control circuit 230 may control the switches S1 to S13 to be turned off and the switch S14 to be turned on, and the quantity of charges on each of the capacitors remains unchanged.

In the second phase, for example, a phase t4 to t5 shown in FIG. 4, the control circuit 230 may control the switches S1~S5, S8~S9 and S11~S13 to be turned off, and the switches S6, S7, S10 and S14 to be turned on. Thus, the first integrating circuit 212 converts the capacitance signal of the first calibration capacitor $C_{C1}$ into the first voltage signal $V_{OUTP}$, and the first charging and discharging circuit 211 charges the detection capacitor $C_X$ until a voltage of the detection capacitor $C_X$ is equal to the power supply voltage $V_{DD}$, and the second charging and discharging circuit 221 charges the second calibration capacitor $C_{C2}$ until a voltage of the second calibration capacitor $C_{C2}$ is equal to the power supply voltage $V_{DD}$, where the input voltage of the second input end of the first integrating circuit 212 is equal to the first voltage $V_{R1}$ in the second phase.

Specifically, after S7 is turned on, the first integrating circuit 212 starts to perform an integration operation. Due to a virtual short characteristic of the first operational amplifier OP1, voltages of an upper electrode plate of the first calibration capacitor $C_{C1}$ and a left electrode plate of the first integrating capacitor are clamped to the voltage $V_{R1}$. Due to a virtual off characteristic of the first operational amplifier OP1, the charges stored on the first calibration capacitor $C_{C1}$ at time t4 will be redistributed on the first calibration capacitor $C_{C1}$ and the first integrating capacitor $C_{S1}$. A charge balance equation is:

$$\frac{I_2 V_{R1} C_X}{I_1} = V_{R1} C_{C1} + (V_{R1} - V_{OUTP}) C_{S1}, \quad \text{Equation (3)}$$

where $C_{S1}$ is a capacitance value of the first integrating capacitor $C_{S1}$.

The first voltage signal $V_{OUTP}$ output by the first integrating circuit 212 can be calculated by Equation (3) as follows:

$$V_{OUTP} = V_{R1} + \frac{(C_{C1} - C_X I_2 / I_1)}{C_{S1}} V_{R1}. \quad \text{Equation (4)}$$

After S6 and S10 are turned on, the detection capacitor $C_x$ is charged until a voltage of the detection capacitor $C_x$ is equal to the power supply voltage $V_{DD}$, and the second calibration capacitor $C_{C2}$ is charged until a voltage of the second calibration capacitor $C_{C2}$ is equal to the power supply voltage $V_{DD}$. At time t5, the quantities of charges stored on the detection capacitor $C_x$ and the second calibration capacitor $C_{C2}$ are respectively as follows:

$$Q_{C_x, t4 \sim t5} = C_X V_{DD}; Q_{C_{C2}, t4 \sim t5} = C_{C2} V_{DD}.$$

In a discharging time period ($t_{discharge}$) of the third phase (for example, a phase t5 to t6 shown in FIG. 4), the control circuit 230 controls the switches S1~S4, S6~S8 and S10~S13 to be turned off, and the switches S5, S9 and S14 to be turned on. The fourth current source $I_4$ discharges the detection capacitor $C_X$ and the third current source $I_3$ discharges the second calibration capacitor $C_{C2}$ until the voltage of the detection capacitor $C_X$ reaches the second voltage $V_{R2}$. It should be noted that a duration during which the detection capacitor $C_X$ discharges to the fourth current source $I_4$ is equal to a duration during which the second calibration capacitor $C_{C2}$ discharges to the third current source $I_3$. In other words, discharging of the detection capacitor $C_X$ to the fourth current source $I_4$ is performed simultaneously with discharging of the second calibration capacitor $C_{C2}$ to the third current source $I_3$.

Since the non-inverting input end of the comparator is connected to the detection capacitor $C_X$, and an input voltage of the inverting input end thereof has been switched to the second voltage $V_{R2}$, a signal output by an output end of the comparator to the control circuit 230 is reversed when the voltage of the detection capacitor $C_X$ reaches the second voltage $V_{R2}$, so that the control circuit 230 knows when the detection capacitor $C_X$ is discharged to a voltage equal to the second voltage $V_{R2}$, and controls S5, S9, S14 to be turned off and S13 to be turned on when the voltage of the detection capacitor $C_X$ reaches the second voltage $V_{R2}$ (at the end of a time period in the third phase), so that the input voltage of the inverting input end of the comparator is switched to the first voltage $V_{R1}$ again.

The length of the time $t_{discharge}$ during which the detection capacitor $C_X$ discharges to the fourth current source $I_4$ until the voltage of the detection capacitor $C_X$ reaches the second voltage $V_{R2}$ is as follows:

$$t_{discharge} = \frac{(V_{DD} - V_{R2}) C_X}{I_4}, \quad \text{Equation (5)}$$

where $I_4$ is a current value of the fourth current source $I_4$.

At time t6, the quantity of charges stored on the second calibration capacitor $C_{C2}$ is as follows:

$$Q_{C_2, t5\sim t6} =$$ Equation (6)

$$Q_{C_2, t4\sim t5} - I_3 t_{discharge} = C_{C2} V_{DD} - \frac{I_3(V_{DD} - V_{R2})C_X}{I_4},$$

where $t_{discharge}$ shall satisfy a condition $t_{discharge} \leq t6-t5$.

Optionally, in order to avoid charge leakage caused by frequent switching of a switch, a buffer phase may be further included after the third phase, for example, t6 to t7 shown in FIG. 4. In the buffer phase, the control circuit 230 may control the switches S1~S12 and S14 to be turned off and the switch S13 to be turned on, and the first voltage signal $V_{OUTP}$ output by the first integrating circuit 212 and the second voltage signal $V_{OUTN}$ remain unchanged.

In the fourth phase, for example, a phase t7 to t8 shown in FIG. 4, the control circuit 230 may control the switches S2~S3, S5~S7, S9~S12 and S14 to be turned off and the switches S1, S4, S8 and S13 to be turned on. The second integrating circuit 222 converts the capacitance signal of the second calibration capacitor $C_{C2}$ into the first voltage signal $V_{OUTN}$, and the first charging and discharging circuit 211 discharges the detection capacitor $C_X$ until a voltage of the detection capacitor $C_X$ is equal to zero, and discharges the first calibration capacitor $C_{C1}$ until a voltage of the first calibration capacitor $C_{C1}$ is equal to zero, where the input voltage of the second input end of the second integrating circuit is equal to the second voltage $V_{R2}$.

Specifically, after S8 is turned on, the second integrating circuit 222 starts to perform an integration operation. Due to a virtual short characteristic of the second operational amplifier OP2, voltages of an upper electrode plate of the second calibration capacitor $C_{C2}$ and a left electrode plate of the second integrating capacitor $C_{S2}$ are clamped to the second voltage $V_{R2}$. Due to a virtual off characteristic of the second operational amplifier OP2, the charges stored on the second calibration capacitor $C_{C2}$ at time t7 will be redistributed on the second calibration capacitor $C_{C2}$ and the second integrating capacitor $C_{S2}$. A charge balance equation is:

$$C_{C2} V_{DD} - \frac{I_3(V_{DD} - V_{R2})C_X}{I_4} = V_{R2} C_{C2} - (V_{R2} - V_{OUTN}) C_{S2},$$ Equation (7)

where $C_{S2}$ is a capacitance value of the second integrating capacitor $C_{S2}$.

The second voltage signal $V_{OUTN}$ output by the second integrating circuit 222 can be calculated by Equation (7) as follows:

$$V_{OUTN} = V_{R2} - \frac{(C_{C2} - C_X I_3/I_4)}{C_{S2}}(V_{DD} - V_{R2}).$$ Equation (8)

After the switches S1 and S4 are turned on, the detection capacitor $C_x$ is discharged until a voltage of the detection capacitor $C_x$ is equal to zero, the first calibration capacitor $C_{C1}$ is discharged until a voltage of the first calibration capacitor $C_{C1}$ is equal to zero, and at time t5, the quantities of charges stored on the detection capacitor $C_x$ and the first calibration capacitor $C_{C1}$ are both zero.

In the process of capacitance detection, for the detection capacitor $C_X$, a process from the first phase to the fourth phase may be repeatedly executed for N times, that is, a time period t2 to t8 in FIG. 4 is repeated for N times, where N is an even number. FIG. 4 shows only the case of N=2. After the above process is repeatedly executed for N times, the first voltage signal $V_{OUTP}$ output by the first integrating circuit 212 and the second voltage signal $V_{OUTN}$ output by the second integrating circuit 222 are respectively as follows:

$$V_{OUTP} = V_{R1} + \frac{(C_{C1} - C_X I_2/I_1)}{C_{S1}} V_{R1}(N/2),$$ Equation (9)

$$V_{OUTN} = V_{R2} - \frac{(C_{C2} - C_X I_3/I_4)}{C_{S2}}(V_{DD} - V_{R2})(N/2),$$ Equation (10)

where, optionally, $C_c = C_X I_2/I_1$, that is, $C_{C1} - C_X I_2/I_1 = 0$ and $C_{C2} = C_X I_3/I_4$, that is, $C_{C2} - I_3/I_4 = 0$.

When a capacitance sensor is not operated, a capacitance value of the detection capacitor $C_X$ is equal to the base capacitance value $C_{x0}$, the first voltage signal $V_{OUTP}$ output by the first integrating circuit 212 is equal to $V_{R1}$, and the second voltage signal $V_{OUTN}$ output by the second integrating circuit 222 is equal to $V_{R2}$, and at this time, a differential operation is performed on the first voltage signal $V_{OUTP}$ output by the first integrating circuit 212 and the second voltage signal $V_{OUTN}$ output by the second integrating circuit 222 to obtain a first differential signal (for example, equal to $V_{R1} - V_{R2}$).

When the sensor is operated, for example, a user touches a touch point corresponding to the detection capacitor, a capacitance value of $C_X$ to be detected is changed from the base capacitance value $C_{x0}$ to $C_{x0} \pm \Delta C_x$, and according to Equations (9) and (10), the first voltage signal $V_{OUTP}$ output by the first integrating circuit 212 and the second voltage signal $V_{OUTN}$ output by the second integrating circuit 222 can be respectively obtained as follows:

$$V_{OUTP} = V_{R1} - \frac{\Delta C_X I_2/I_1}{C_{S1}} V_{R1}(N/2)$$ Equation (11)

$$V_{OUTN} = V_{R2} + \frac{\Delta C_X I_3/I_4}{C_{S2}}(V_{DD} - V_{R2})(N/2)$$ Equation (12)

The processing circuit 240 may perform differential processing on the first voltage signal $V_{OUTP}$ and the second voltage signal $V_{OUTN}$ based on Equations (11) and (12) to obtain a second differential signal, and the capacitance variation $\Delta C_x$ of the detection capacitor $C_x$ may be determined according to the first differential signal and the second differential signal. In particular, when $V_{R1} = V_{R2}$, the first differential signal is zero, and therefore the second differential signal can directly reflect the capacitance variation $\Delta_{Cx}$, that is, the capacitance variation $\Delta C_x$ can be directly obtained according to the second differential signal without taking the first differential signal into account.

In addition, according to Equations (11) and (12), it can be seen that due to presence of the first calibration capacitor $C_{C1}$ and the second calibration capacitor $C_{C2}$, the first voltage signal $V_{OUTP}$ and the second voltage signal $V_{OUTN}$ only reflect a change of the capacitance variation $\Delta C_x$ without regard to a capacitance value of the detection capacitor $C_x$ (which can be understood as the base capacitance value $C_{x0}$ of the detection capacitor $C_x$). In other words, the first calibration capacitor $C_{C1}$ cancels the contribution of the base capacitance value $C_{x0}$ to the first voltage signal $V_{OUTP}$ output by the first integrating circuit 212; and the second calibration capacitor $C_{C2}$ cancels the contribution of the base capacitance value $C_{x0}$ of the detection capacitor $C_x$ to the second voltage signal $V_{OUTN}$ output by the second integrating circuit 222. Therefore, when a conductor (for example, a finger) approaches or touches the detection electrode, a signal weight output by the capacitance detecting circuit is a useful signal weight, that is, a signal weight contributed by $\Delta C_x$, so that sensitivity of the capacitance detection could be greatly enhanced.

In type 1, description is made by the example of charging followed by discharging, that is, the detection capacitor $C_x$ and the first calibration capacitor $C_{C1}$ are charged first until the voltage of the detection capacitor $C_x$ reaches the first voltage $V_{R1}$, and then the detection capacitor $C_x$ and the second calibration capacitor $C_{C2}$ are discharged until the voltage of the detection capacitor $C_x$ reaches the second voltage $V_{R2}$. However, the order of charging and discharging is not limited in the embodiment of the present application. For example, in the initialization phase, the control circuit 230 may control the detection capacitor $C_x$ and the first calibration capacitor $C_{C1}$ to be charged to the power supply voltage $V_{DD}$; in the first phase, the detection capacitor $C_x$ and the first calibration capacitor $C_{C1}$ are respectively discharged to the corresponding connected current sources until the voltage of the detection capacitor $C_x$ reaches the second voltage $V_{R2}$; in the second phase, the first integrating circuit performs integration, and the detection capacitor $C_x$ and the second calibration capacitor $C_{C2}$ are charged to the power supply voltage $V_{DD}$; in the third phase, the first current source $I_1$ and the third current source $I_3$ charge the detection capacitor $C_x$ and the second calibration capacitor $C_{C2}$ respectively until the voltage of the detection capacitor $C_x$ reaches the first voltage $V_{R1}$; and in the fourth phase, the second integrating circuit performs integration, and the detection capacitor $C_x$ and the first calibration capacitor $C_{C1}$ are charged to the power supply voltage $V_{DD}$. At this time, one end of the first switch is connected to the detection capacitor and the other end is connected to the power supply. One end of the fourth switch is connected to the first calibration capacitor $C_{C1}$ and the other end is connected to the power supply. One end of the sixth switch is connected to the second calibration capacitor and the other end is grounded.

Type 2

Optionally, a first charging and discharging circuit 211 includes a first current source $I_1$ and a second current source $I_2$, and a second charging and discharging circuit 221 includes a third current source $I_3$.

The first current source $I_1$ is connected to the detection capacitor $C_X$ for preforming charging or discharging on the detection capacitor $C_X$, and the second current source $I_2$ is connected to the first calibration capacitor $C_{C1}$ for performing charging or discharging on the first calibration capacitor $C_{C1}$, and a ratio of a capacitance value of the first calibration capacitor $C_{C1}$ to the base capacitance value $C_{X0}$ is equal to a ratio of a current value of the second current source $I_2$ to a current value of the first current source $I_1$, that is, $C_{C1}/C_{X0}=I_2/I_1$.

The third current source $I_3$ is connected to the second calibration capacitor $C_{C2}$ for performing charging or discharging on the second calibration capacitor $C_{C2}$, and a ratio of a capacitance value of the second calibration capacitor $C_{C2}$ to the base capacitance value $C_{X0}$ is equal to a ratio of a current value of the third current source $I_3$ to the current value of the first current source $I_1$, that is, $C_{C2}/C_{X0}=I_3/I_1$.

First, description is given to a case where the first current source $I_1$ is configured to charge the detection capacitor $C_X$ in type 2.

In an initialization phase, the control circuit 230 is configured to control charges on the first integrating circuit 212 and the second integrating circuit 222 to be cleared.

In a first phase, the first charging and discharging circuit 211 is configured to discharge the detection capacitor until a voltage of the detection capacitor $C_X$ is equal to zero, and discharge the first calibration capacitor $C_{C1}$ until a voltage of the first calibration capacitor $C_{C1}$ is equal to zero, and the second charging and discharging circuit 221 is configured to charge the second calibration capacitor $C_{C2}$ until a voltage of the second calibration capacitor $C_{C2}$ is equal to a power supply voltage $V_{DD}$.

In a second phase, the first current source $I_1$ is configured to charge the detection capacitor $C_X$ until a voltage of the detection capacitor $C_X$ reaches a first voltage $V_{R1}$, the second current source $I_2$ is configured to charge the first calibration capacitor $C_{C1}$ in a time period $t_{charge}$ during which the first current source $I_1$ charges the detection capacitor $C_X$, and the third current source $I_3$ is configured to discharge the second calibration capacitor $C_{C2}$ to the third current source $I_3$ in a time period $t_{charge}$ during which the first current source $I_1$ charges the detection capacitor $C_X$.

In a third phase, the first integrating circuit 212 is configured to convert a capacitance signal of the first calibration capacitor $C_{C1}$ into the first voltage signal $V_{OUTP}$, and the second integrating circuit 222 is configured to convert a capacitance signal of the second calibration capacitor $C_{C2}$ into the second voltage signal $V_{OUTN}$. And the input voltage of the second input end of the first integrating circuit 212 is equal to the first voltage $V_{R1}$ in the third phase, and the input voltage of the second input end of the second integrating circuit 222 is equal to the second voltage $V_{R2}$ in the third phase.

Optionally, the capacitance detecting circuit further includes a comparator (comparator, COMP), a first input end of the comparator (for example, a non-inverting input end) is connected to the detection capacitor $C_X$, an output end of the comparator is connected to the control circuit 230, and a second input end of the comparator (for example, an inverting input end) is configured to input the first voltage $V_{R1}$ in the second phase.

When the comparator determines that the voltage of the detection capacitor $C_X$ reaches the first voltage $V_{R1}$ in the second phase, the control circuit 230 controls the first charging and discharging circuit 211 to stop performing charging and discharging on the detection capacitor $C_X$ and the first calibration capacitor $C_{C1}$ and controls the second charging and discharging circuit 221 to stop performing charging and discharging on the second calibration capacitor $C_{C2}$.

Figure 5:
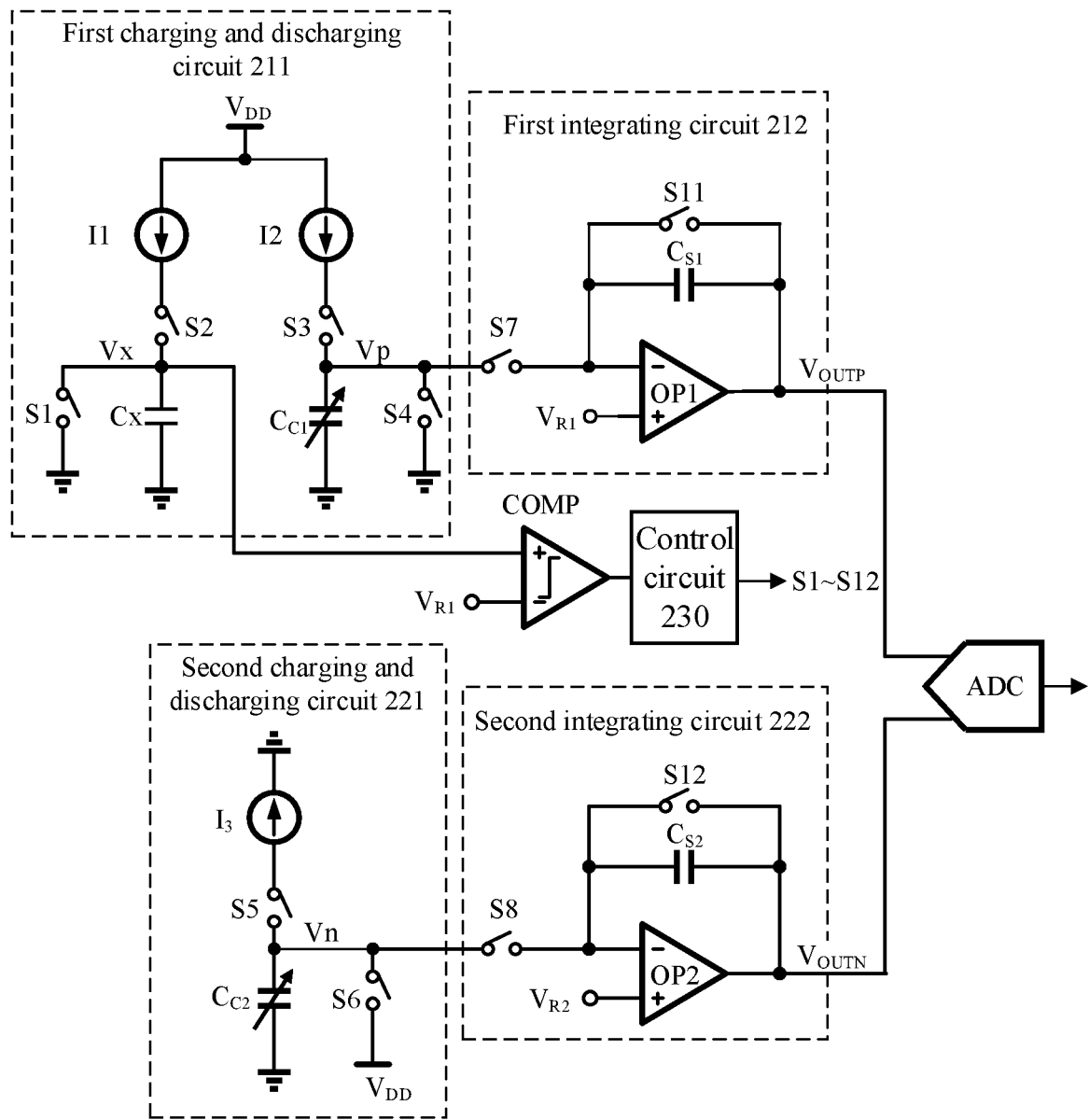
FIG. 5 is a schematic circuit diagram of a capacitance detecting circuit according to another embodiment of the present application.

Description is made by the example of FIG. 5. On the basis of the foregoing illustration of the circuit structure of FIG. 5, the capacitance detecting circuit may further include a switch set for controlling each of the capacitors to enter into a different phase or enter into a charging/discharging phase. For example, the first charging and discharging circuit 211 further includes a first switch S1, a second switch S2, a third switch S3 and a fourth switch S4, the second charging and discharging circuit 221 includes a fifth switch S5 and a sixth switch S6, the first integrating circuit 212 includes a seventh switch S7 and an eleventh switch S11, and the second integrating circuit 222 includes an eighth switch S8 and a twelfth switch S12.

One end of S1 is grounded and the other end is connected to a first end of the detection capacitor $C_X$; one end of S2 is connected to the first current source $I_1$ and the other end is connected to the first end of the detection capacitor $C_X$; one end of S3 is connected to the second current source $I_2$ and the other end is connected to a first end of the first calibration capacitor $C_{C1}$; one end of S4 is grounded and the other end is connected to the first end of the first calibration capacitor $C_{C1}$; one end of S7 is connected to the first end of the first calibration capacitor $C_{C1}$ and the other end is connected to a first input end of the first integrating circuit 212; S11 is connected in parallel with a first integrating capacitor $C_{S1}$; one end of S5 is connected to a first end of the second calibration capacitor $C_{C2}$ and the other end is connected to the third current source $I_3$; one end of S6 is connected to a power supply and the other end is connected to the first end of the second calibration capacitor $C_{C2}$; one end of S8 is connected to the first end of the second calibration capacitor $C_{C2}$ and the other end is connected to a first input end of the second integrating circuit 222; and S12 is connected in parallel with a second integrating capacitor $C_{S2}$. A second end of the detection capacitor $C_X$, a second end of the first calibration capacitor $C_{C1}$ and a second end of the second calibration capacitor $C_{C2}$ are all grounded.

Figure 6:
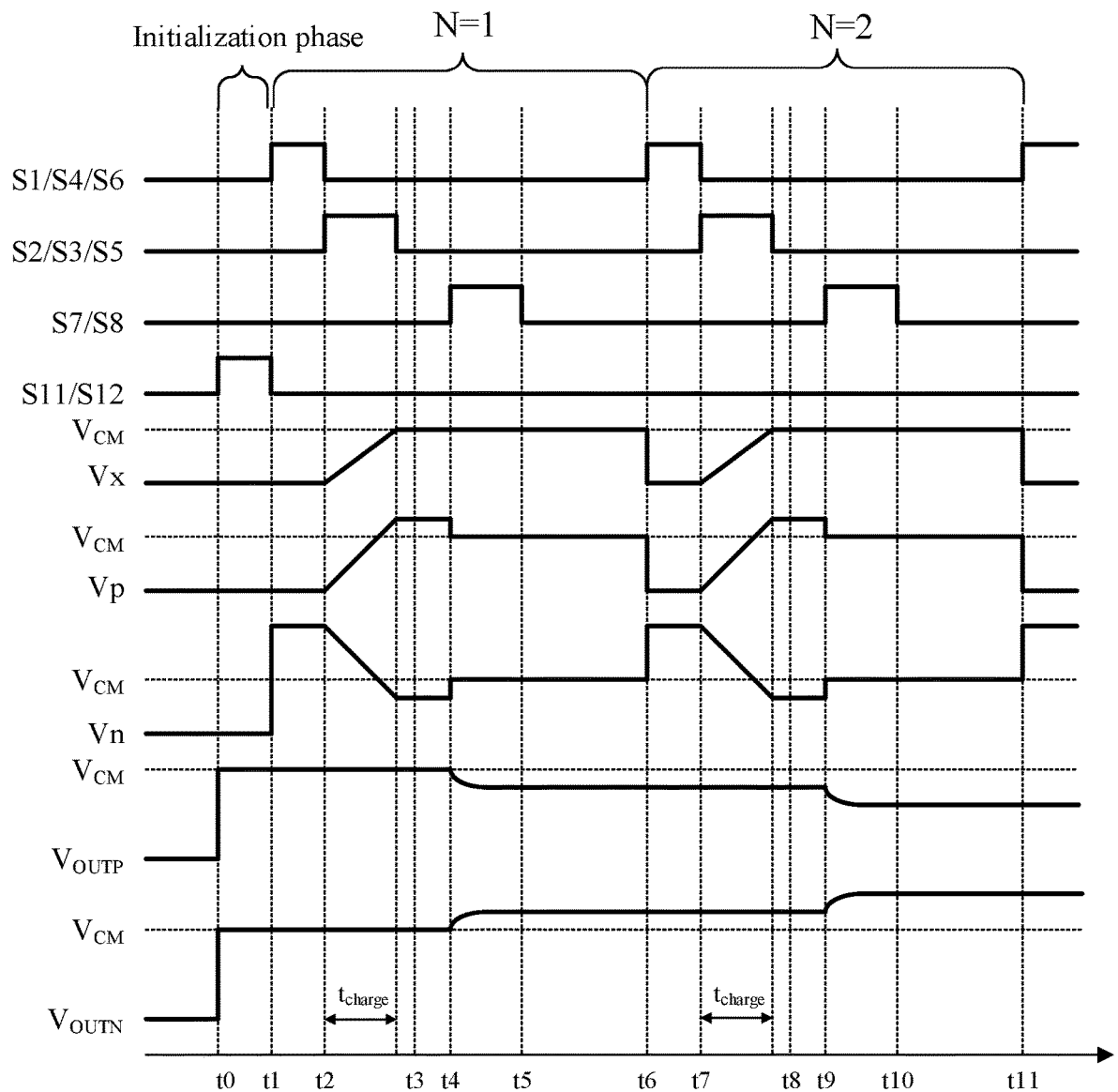
FIG. 6 is a logic timing diagram of a capacitance detecting circuit according to another embodiment of the present application.

Optionally, in the initialization phase, for example, a phase t0 to t1 shown in FIG. 6, the control circuit 230 may control S11 and S12 to be turned on, so that a first integrating capacitor $C_{S1}$ and a second integrating capacitor $C_{S2}$ are completely discharged, that is, until voltages of the first integrating capacitor $C_{S1}$ and the second integrating capacitor $C_{S2}$ are equal to zero. At this time, the quantities of charges stored on the first integrating capacitor $C_{S1}$ and the second integrating capacitor $C_{S2}$ are zero, the first voltage signal $V_{OUTP}$ output by the first integrating circuit 212 is equal to $V_{R1}$, and the second voltage signal $V_{OUTN}$ output by the second integrating circuit 222 is equal to $V_{R2}$. When the quantities of charges stored on the first integrating capacitor $C_{S1}$ and the second integrating capacitor $C_{S2}$ reach an upper limit, S11 and S12 may be controlled to be turned on so as to clear the charges stored on the first integrating capacitor $C_{S1}$ and the second integrating capacitor $C_{S2}$.

Next, the control circuit 230 may control the switching state of the above switches, that is, on or off, thereby implementing operations from the first phase to the third phase. A working process of the capacitance detecting circuit is specifically illustrated below by taking switching states shown in Table 2 and a logic timing diagram shown in FIG. 6 as an example.

TABLE 2

| First Phase | OFF | S2, S3, S5, S7, S8, S11, S12 |
|---|---|---|
|  | ON | S1, S4, S6 |
| Second Phase | OFF | S1, S4, S6~S8, S11, S12 |
|  | ON | S2, S3, S5 |
| Buffer Phase |  | S1~S12 are all turned off |
| Third Phase | OFF | S1~S6, S11, S12 |
|  | ON | S7, S8 |
| Buffer Phase |  | S1~S12 are all turned off |

In the first phase, for example, a phase t1 to t2 shown in FIG. 6, the control circuit 230 may control S1, S4 and S6 to be turned off in the first phase, and S2, S3, S5, S7, S8, S11 and S12 to be turned on. Thus the detection capacitor $C_X$ is discharged until a voltage of the detection capacitor $C_X$ is equal to zero, the first calibration capacitor $C_{C1}$ is discharged until a voltage of the first calibration capacitor $C_{C1}$ is equal to zero, and the second calibration capacitor $C_{C2}$ is charged until a voltage of the second calibration capacitor $C_{C2}$ is equal to the power supply voltage.

At time t2, the quantities of charges stored on the detection capacitor $C_X$, the first calibration capacitor $C_{C1}$ and the second calibration capacitor $C_{C2}$ are respectively as follows:

$$Q_{C_X,t1\sim t2}=0; Q_{C_{C1},t1\sim t2}=0; Q_{C_{C2},t1\sim t2}=C_{C2}V_{DD}.$$

At this time, the first voltage signal $V_{OUTP}$ output by the first integrating circuit 212 is equal to $V_{R1}$, and the second voltage signal $V_{OUTN}$ output by the second integrating circuit 222 is equal to $V_{R2}$.

In a charging phase ($t_{charge}$) of the second phase (for example, a phase t2 to t3 shown in FIG. 6), S2, S3 and S5 are turned on, and S1, S4, S6~S8, S11 and S12 are turned off. Thereby, the first current source $I_1$ charges the detection capacitor $C_X$, the second current source $I_2$ charges the first calibration capacitor $C_{C1}$, and the second calibration capacitor $C_{C2}$ discharges to the third current source $I_3$ until the voltage of the detection capacitor $C_X$ reaches the first voltage $V_{R1}$. It should be noted that a duration during which the first current source $I_1$ charges the detection capacitor $C_X$, a duration during which the second current source $I_2$ charges the first calibration capacitor $C_{C1}$ and a duration during which the second calibration capacitor $C_{C2}$ discharges to the third current source $I_3$ are equal. In other words, charging of the detection capacitor $C_X$ by the first current source $I_1$, charging of the first calibration capacitor $C_{C1}$ by the second current source $I_2$ and discharging of the second calibration capacitor $C_{C2}$ to the third current source $I_3$ are performed simultaneously.

Since the non-inverting input end of the comparator is connected to the detection capacitor $C_X$, and an input voltage of the inverting input end thereof is equal to the first voltage $V_{R1}$, a signal output by an output end of the comparator to the control circuit 230 is reversed when the voltage of the detection capacitor $C_X$ reaches the first voltage $V_{R1}$ (at the end of a time period in the second phase), so that the control circuit 230 knows when the detection capacitor $C_X$ is charged to a voltage equal to the first voltage $V_{R1}$, and controls S2, S3 and S5 to be turned off.

In the embodiment of the present application, the non-inverting input end and the inverting input end of the comparator may be exchanged, as long as the control circuit 230 can detect that the signal output by the comparator is reversed.

The length of the time period $t_{charge}$ during which the first current source $I_1$ charges the detection capacitor $C_X$ until the voltage of the detection capacitor $C_X$ reaches the first voltage $V_{R1}$ is as follows:

$$t_{charge} = \frac{V_{R1}C_X}{I_1}, \quad \text{Equation (13)}$$

where $C_X$ is a capacitance value of the detection capacitor $C_X$, and $I_1$ is a current value of the first current source $I_1$.

At time t3, the quantities of charges stored on the first calibration capacitor $C_{C1}$ and the second calibration capacitor $C_{C2}$ are respectively as follows:

$$Q_{C_{C1},t2\sim t3} = I_2 t_{charge} = \frac{I_2 V_{R1} C_X}{I_1}, \quad \text{Equation (14)}$$

$$Q_{C_{C2},t2\sim t3} = Q_{C_{C2},t1\sim t2} - I_3 t_{charge} = C_{C2}V_{DD} - \frac{I_3 V_{R1} C_X}{I_1}, \quad \text{Equation (15)}$$

where $t_{charge}$ shall satisfy a condition $t_{charge} \le t3-t2$. $I_2$ is a current value of the second current source $I_2$, $I_3$ is a current value of the third current source $I_3$, $C_{C1}$ is a capacitance value of a first calibration capacitor $C_{C2}$, and $V_{DD}$ is a power supply voltage.

Optionally, in order to avoid charge leakage caused by frequent switching of a switch, a buffer phase may be further included after the second phase (for example, t3 to t4 shown in FIG. 6). In the buffer phase, the control circuit 230 may control all the switches to remain off, and the quantity of charges on each of the capacitors remains unchanged.

In the third phase (for example, a phase t4 to t5 shown in FIG. 6), the control circuit 230 controls the switches S7 and S8 to be turned on, and the switches S1~S6, S11 and S12 to be turned off. Thus, the first integrating circuit 212 converts the capacitance signal of the first calibration capacitor $C_{C1}$ into the first voltage signal $V_{OUTP}$, and the second integrating circuit 222 converts the capacitance signal of the second calibration capacitor $C_{C2}$ into the second voltage signal $V_{OUTN}$. And the input voltage of the second input end of the first integrating circuit 212 is equal to the first voltage $V_{R1}$, and the input voltage of the second input end of the second integrating circuit 222 is equal to the second voltage $V_{R2}$.

Specifically, after S7 and S8 are turned on, the first integrating circuit 212 and the second integrating circuit 222 start to perform integration operations. Due to a virtual short characteristic of the first operational amplifier OP1, voltages of an upper electrode plate of the first calibration capacitor $C_{C1}$ and a left electrode plate of the first integrating capacitor $C_{S1}$ are clamped to the voltage $V_{R1}$. Due to a virtual off characteristic of the first operational amplifier OP1, the charges stored on the first calibration capacitor $C_{C1}$ at time t4 will be redistributed on the first calibration capacitor $C_{C1}$ and the first integrating capacitor $C_{S1}$. A charge balance equation is:

$$\frac{I_2 V_{R1} C_X}{I_1} = V_{R1} C_{C1} + (V_{R1} - V_{OUTP}) C_{S1}, \quad \text{Equation (16)}$$

where $C_{S1}$ is a capacitance value of the first integrating capacitor $C_{S1}$.

The first voltage signal $V_{OUTP}$ output by the first integrating circuit 212 can be calculated by Equation (4) as follows:

$$V_{OUTP} = V_{R1} + \frac{(C_{C1} - C_X I_2/I_1)}{C_{S1}} V_{R1}. \quad \text{Equation (17)}$$

Due to a virtual short characteristic of the second operational amplifier OP2, voltages of an upper electrode plate of the second calibration capacitor $C_{C2}$ and a left electrode plate of the second integrating capacitor $C_{S2}$ are clamped to the second voltage $V_{R2}$. Due to a virtual off characteristic of the second operational amplifier OP2, the charges stored on the second calibration capacitor $C_{C2}$ at time t3 will be redistributed on the second calibration capacitor $C_{C2}$ and the second integrating capacitor $C_{S2}$. A charge balance equation is:

$$C_{C2}V_{DD} - \frac{I_3 V_{R1} C_X}{I_1} = V_{R2} C_{C2} - (V_{R2} - V_{OUTN}) C_{S2}, \quad \text{Equation (18)}$$

where $C_{S2}$ is a capacitance value of the second integrating capacitor $C_{S2}$.

The second voltage signal $V_{OUTN}$ output by the second integrating circuit 222 can be calculated by Equation (18) as follows:

$$V_{OUTN} = V_{R2} - \frac{(C_{C2}(V_{DD} - V_{R2}) - V_{R1} C_X I_3/I_1)}{C_{S2}}. \quad \text{Equation (19)}$$

Optionally, in order to avoid charge leakage caused by frequent switching of a switch, a buffer phase may be further included after the third phase (for example, t5 to t6 shown in FIG. 6). In the buffer phase, the control circuit 230 may control all the switches to remain off, and the first voltage signal $V_{OUTP}$ output by the first integrating circuit 212 and the second voltage signal $V_{OUTN}$ output by the second integrating circuit 222 remain unchanged.

In the process of capacitance detection, for the detection capacitor $C_X$, a process from the first phase to the third phase may be repeatedly executed for N times to enhance sensitivity of the capacitance detection. That is, a time period t1 to t6 in FIG. 6 is repeated for N times, where N is a positive integer. FIG. 6 shows only the case of N=2. After the above process is repeatedly executed for N times, the first voltage signal $V_{OUTP}$ output by the first integrating circuit 212 and the second voltage signal $V_{OUTN}$ output by the second integrating circuit 222 are respectively as follows:

$$V_{OUTP} = V_{R1} + \frac{(C_{C1} - C_X I_2/I_1)}{C_{S1}} V_{R1} N, \quad \text{Equation (20)}$$

$$V_{OUTN} = V_{R2} - \frac{(C_{C2}(V_{DD} - V_{R2}) - V_{R1} C_X I_3/I_1)}{C_{S2}} N, \quad \text{Equation (21)}$$

where, optionally, $C_{C1} = C_X I_2/I_1$, that is, $C_{C1} - C_X I_2/I_1 = 0$, and $C_{C2} = C_X I_3/I_1$, that is, $C_{C2} - C_X I_3/I_1 = 0$.

Optionally, $V_{R1} = V_{R2} = V_{DD}/2 = V_{CM}$.

When a capacitance sensor is not operated, a capacitance value of the detection capacitor $C_X$ is equal to the base capacitance value $C_{X0}$, the first voltage signal $V_{OUTP}$ output by the first integrating circuit 212 and the second voltage signal $V_{OUTN}$ output by the second integrating circuit 222 satisfy $V_{OUTP} = V_{OUTN} = V_{CM}$, and at this time, a differential operation is performed on the first voltage signal $V_{OUTP}$ and the second voltage signal $V_{OUTN}$ to obtain a first differential signal.

When the sensor is operated, for example, a user touches a touch point corresponding to the detection capacitor, a capacitance value of the detection capacitor $C_X$ is changed from the base capacitance value $C_{X0}$ to $C_{X0} + \Delta C_X$, and according to Equations (20) and (21), the first voltage signal $V_{OUTP}$ output by the first integrating circuit 212 and the second voltage signal $V_{OUTN}$ output by the second integrating circuit 222 can be respectively obtained as follows:

$$V_{OUTP} = V_{CM} - \frac{\Delta C_X I_2/I_1}{C_{S1}} V_{CM} N, \quad \text{Equation (22)}$$

-continued $$V_{OUTN} = V_{CM} + \frac{\Delta C_X I_3 / I_1}{C_{S2}} V_{CM} N. \quad \text{Equation (23)}$$

The processing circuit 240 may perform differential processing on the first voltage signal $V_{OUTP}$ and the second voltage signal $V_{OUTN}$ based on Equations (22) and (23) to obtain a second differential signal, and the capacitance variation $\Delta C_X$ of the detection capacitor $C_X$ may be determined according to the first differential signal and the second differential signal. In particular, when $V_{OUTP} = V_{OUTN} = V_{CM}$, the first differential signal is zero, and therefore the second differential signal can directly reflect the capacitance variation $\Delta C_X$, that is, the change of the capacitance variation $\Delta C_X$ can be directly obtained according to the second differential signal without taking the first differential signal into account.

Next, description is given to a case where the first current source $I_1$ is configured to discharge the detection capacitor $C_X$ to the first current source $I_1$ in type 2.

In an initialization phase, the control circuit 230 is configured to control charges on the first integrating circuit 212 and the second integrating circuit 222 to be cleared.

In a first phase, the first charging and discharging circuit 211 is configured to charge the detection capacitor until a voltage of the detection capacitor $C_X$ is equal to a power supply voltage $V_{DD}$, and to charge the first calibration capacitor $C_{C1}$ until a voltage of the first calibration capacitor $C_{C1}$ is equal to the power supply voltage $V_{DD}$, and the second charging and discharging circuit 221 is configured to discharge the second calibration capacitor $C_{C2}$ until a voltage of the second calibration capacitor $C_{C2}$ is equal to zero.

In a second phase, the first current source $I_1$ is configured to discharge the detection capacitor $C_X$ to the first current source $I_1$ until a voltage of the detection capacitor $C_X$ reaches a first voltage, the second current source $I_2$ is configured to discharge the first calibration capacitor $C_{C1}$ to the second current source $I_2$ in a time period $t_{discharge}$ during which the detection capacitor $C_X$ discharges to the first current source $I_1$, and the third current source $I_3$ is configured to charge the second calibration capacitor $C_{C2}$ in a time period $t_{discharge}$ during which the detection capacitor $C_X$ discharges to the first current source $I_1$.

In a third phase, the first integrating circuit 212 is configured to convert a capacitance signal of the first calibration capacitor $C_{C1}$ into the first voltage signal, and the second integrating circuit 222 is configured to convert a capacitance signal of the second calibration capacitor $C_{C2}$ into the second voltage signal, where an input voltage of a second input end of the first integrating circuit 212 is equal to the first voltage $V_{R1}$ in the third phase, and an input voltage of a second input end of the second integrating circuit 222 is equal to a second voltage $V_{R2}$ in the third phase.

Optionally, the capacitance detecting circuit further includes a comparator COMP, a first input end of the comparator (for example, a non-inverting input end) is connected to the detection capacitor $C_X$, an output end of the comparator is connected to the control circuit 230, and a second input end of the comparator (for example, an inverting input end) is configured to input the first voltage $V_{R1}$ in the second phase.

When the comparator determines that the voltage of the detection capacitor $C_X$ reaches the first voltage $V_{R1}$ in the second phase, the control circuit 230 controls the first charging and discharging circuit 211 to stop performing charging and discharging on the detection capacitor $C_X$ and the first calibration capacitor $C_{C1}$ and controls the second charging and discharging circuit 221 to stop performing charging and discharging on the second calibration capacitor $C_{C2}$.

Figure 7:
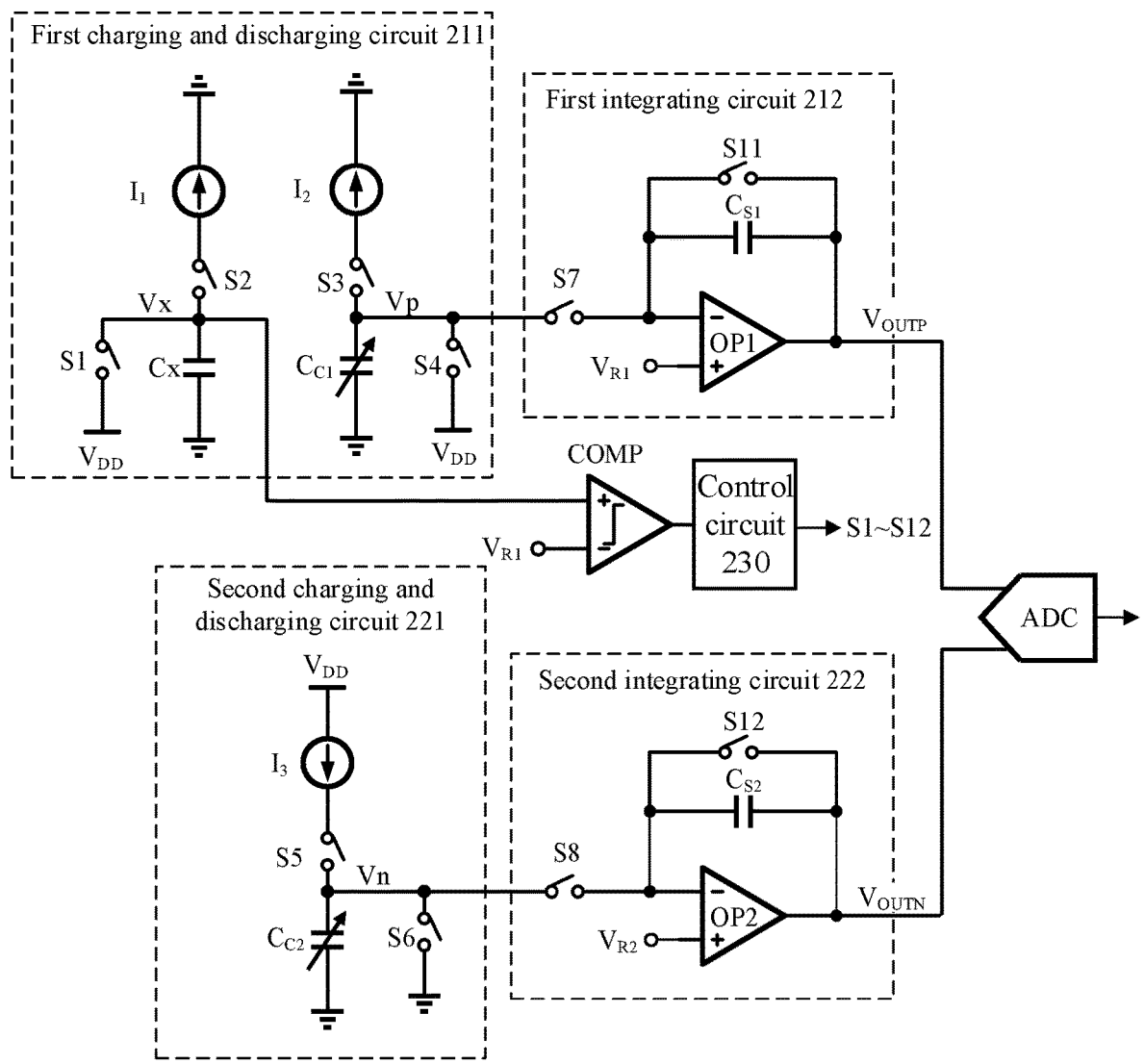
FIG. 7 is a schematic circuit diagram of a capacitance detecting circuit according to yet another embodiment of the present application.

Description is made by the example of FIG. 7. On the basis of the foregoing illustration of the circuit structure of FIG. 5, the capacitance detecting circuit further includes a switch set for controlling each of the capacitors to enter into a different phase or enter into a charging/discharging phase. For example, the first charging and discharging circuit 211 further includes a first switch S1, a second switch S2, a third switch S3 and a fourth switch S4, the second charging and discharging circuit 221 includes a fifth switch S5 and a sixth switch S6, the first integrating circuit 212 includes a seventh switch S7 and an eleventh switch S11, and the second integrating circuit 222 includes an eighth switch S8 and a twelfth switch S12.

One end of S1 is connected to a power supply and the other end is connected to a first end of the detection capacitor $C_X$; one end of S2 is connected to the first current source $I_1$ and the other end is connected to the first end of the detection capacitor $C_X$; one end of S3 is connected to the second current source $I_2$ and the other end is connected to a first end of the first calibration capacitor $C_{C1}$; one end of S4 is connected to a power supply and the other end is connected to the first end of the first calibration capacitor $C_{C1}$; one end of S5 is connected to a first end of the second calibration capacitor $C_{C2}$ and the other end is connected to the third current source $I_3$; one end of S6 is grounded and the other end is connected to the first end of the second calibration capacitor $C_{C2}$; one end of S7 is connected to the first end of the first calibration capacitor $C_{C1}$ and the other end is connected to the first input end of the first integrating circuit 212; S11 is connected in parallel with a first integrating capacitor $C_{S1}$; one end of S8 is connected to the first end of the second calibration capacitor $C_{C2}$ and the other end is connected to a first input end of a second integrating circuit 222; and S12 is connected in parallel with the second integrating capacitor. A second end of the detection capacitor $C_X$, a second end of the first calibration capacitor $C_{C1}$ and a second end of the second calibration capacitor $C_{C2}$ are all grounded.

Figure 8:
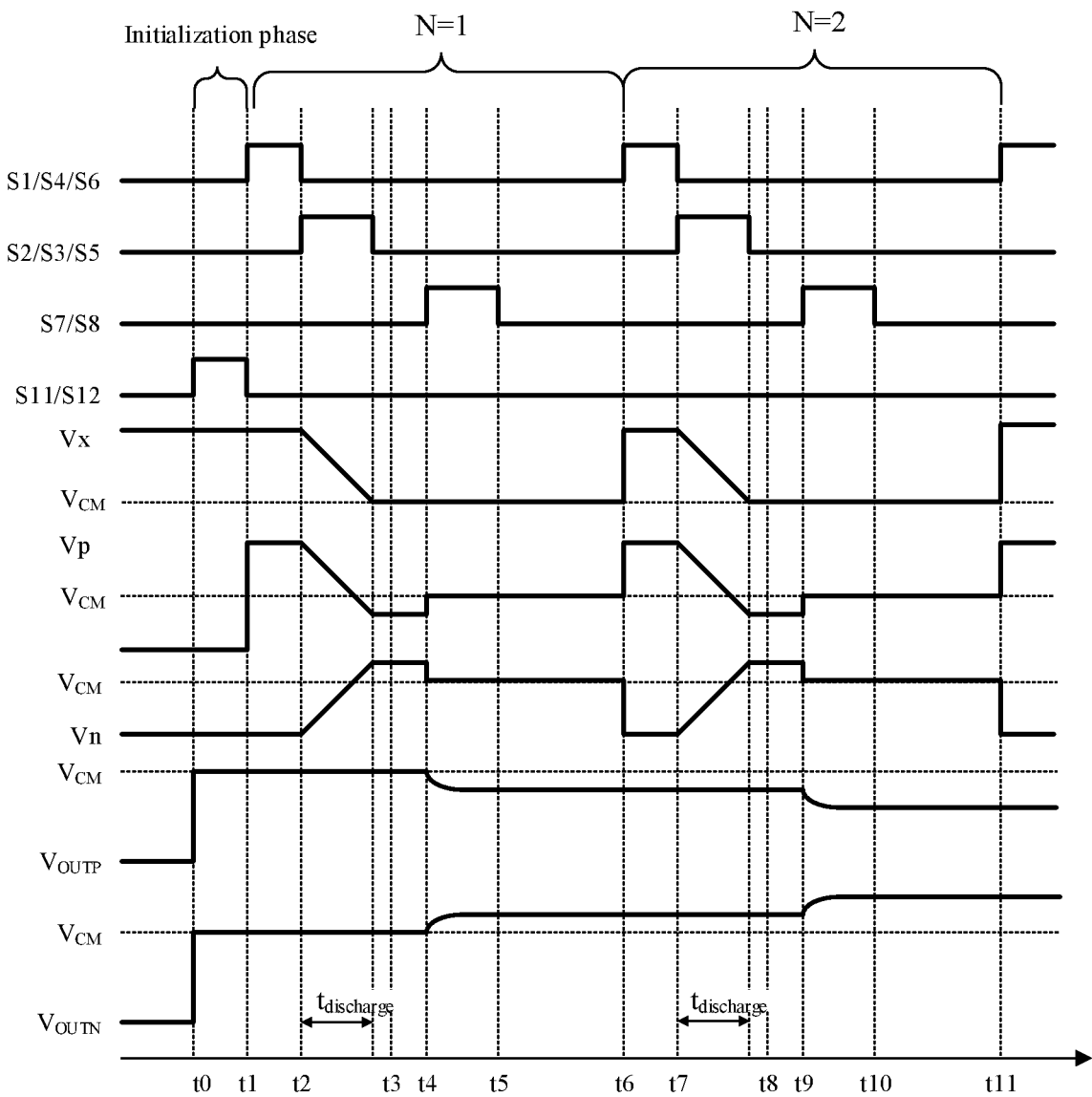
FIG. 8 is a logic timing diagram of a capacitance detecting circuit according to yet another embodiment of the present application.

Optionally, in the initialization phase, for example, a phase t0 to t1 shown FIG. 8, the control circuit 230 may control S11 and S12 to be turned on, so that a first integrating capacitor $C_{S1}$ and a second integrating capacitor $C_{S2}$ are completely discharged, that is, until voltages of the first integrating capacitor $C_{S1}$ and the second integrating capacitor $C_{S2}$ are equal to zero. At this time, the quantities of charges stored on the first integrating capacitor $C_{S1}$ and the second integrating capacitor $C_{S2}$ are zero, the first voltage signal $V_{OUTP}$ output by the first integrating circuit 212 is equal to $V_{R1}$, and the second voltage signal $V_{OUTN}$ output by the second integrating circuit 222 is equal to $V_{R2}$. When the quantities of charges stored on the first integrating capacitor $C_{S1}$ and the second integrating capacitor $C_{S2}$ reach an upper limit, S11 and S12 may be controlled to be turned on so as to clear the charges stored on the first integrating capacitor $C_{S1}$ and the second integrating capacitor $C_{S2}$.

Next, the control circuit 230 may control the switching state of the above switches, that is, on or off, thereby implementing operations from the first phase to the third phase. A working process of the capacitance detecting circuit is specifically illustrated below by taking switching states shown in Table 3 and a logic timing diagram shown in FIG. 8 as an example.

TABLE 3

| First Phase | OFF | S2, S3, S5, S7, S8, S11, S12 |
|---|---|---|
| | ON | S1, S4, S6 |
| Second Phase | OFF | S1, S4, S6~S8, S11, S12 |
| | ON | S2, S3, S5 |
| Buffer Phase | | S1~S12 are all turned off |
| Third Phase | OFF | S1~S6, S11, S12 |
| | ON | S7, S8 |
| Buffer Phase | | S1~S12 are all turned off |

In the first phase, for example, a phase t1 to t2 shown in FIG. 8, the control circuit 230 may control S1, S4 and S6 to be turned off in the first phase, and S2, S3, S5, S7, S8, S11 and S12 to be turned on. Thus the detection capacitor $C_x$ is charged until a voltage of the detection capacitor $C_x$ is equal to the power supply voltage $V_{DD}$, the first calibration capacitor $C_{C1}$ is charged until a voltage of the first calibration capacitor $C_{C1}$ is equal to the power supply voltage $V_{DD}$, and the second calibration capacitor $C_{C2}$ is discharged until a voltage of the second calibration capacitor $C_{C2}$ is equal to zero.

At time t2, the quantities of charges stored on the detection capacitor $C_x$, the first calibration capacitor $C_{C1}$ and the second calibration capacitor $C_{C2}$ are respectively as follows:

$$Q_{Cx,t1-t2} = C_X V_{DD}; Q_{CC1,t1-t2} = C_{C1} V_{DD}; Q_{CC1,t1-t2} = 0.$$

At this time, the first voltage signal $V_{OUTP}$ output by the first integrating circuit 212 is equal to $V_{R1}$, and the second voltage signal $V_{OUTN}$ output by the second integrating circuit 222 is equal to $V_{R2}$.

In a discharging phase ($t_{discharge}$) of the second phase (for example, a phase t2 to t3 shown in FIG. 8), S2, S3 and S5 are turned on, and S1, S4, S6~S8, S11 and S12 are turned off. Thereby, the detection capacitor $C_X$ discharges to the first current source $I_1$, the first calibration capacitor $C_{C1}$ discharges to the second current source $I_2$, and the third current source $I_3$ charges the second calibration capacitor $C_{C2}$ until the voltage of the detection capacitor $C_X$ reaches the first voltage $V_{R1}$. It should be noted that a duration during which the detection capacitor $C_X$ discharges to the first current source $I_1$, a duration during which the first calibration capacitor $C_{C1}$ discharges to the second current source $I_2$, and a duration during which the third current source $I_3$ charges the second calibration capacitor $C_{C2}$ are equal. In other words, discharging of the detection capacitor $C_X$ to the first current source $I_1$, discharging of the first calibration capacitor $C_{C1}$ to the second current source $I_2$, and charging of the third current source $I_3$ to the second calibration capacitor $C_{C2}$ are performed simultaneously.

Since the non-inverting input end of the comparator is connected to the detection capacitor $C_X$, and an input voltage of the inverting input end thereof is equal to the first voltage $V_{R1}$, a signal output by an output end of the comparator to the control circuit 230 is reversed when the voltage of the detection capacitor $C_X$ reaches the first voltage $V_{R1}$ (at the end of a time period in the second phase), so that the control circuit 230 knows when the detection capacitor $C_X$ is charged to a voltage equal to the first voltage $V_{R1}$, and controls S2, S3 and S5 to be turned off when the voltage of the detection capacitor $C_X$ reaches the first voltage $V_{R1}$.

In the embodiment of the present application, the non-inverting input end and the inverting input end of the comparator may be exchanged, as long as the control circuit 230 can detect that the signal output by the comparator is reversed.

The length of the time $t_{discharge}$ during which the detection capacitor $C_X$ discharges to the first current source $I_1$ until the voltage of the detection capacitor $C_X$ reaches the first voltage is as follows:

$$t_{discharge} = \frac{(V_{DD} - V_{R1})C_X}{I_1}, \quad \text{Equation (24)}$$

where $C_X$ is a capacitance value of the detection capacitor $C_X$, and $I_1$ is a current value of the first current source $I_1$.

At time t3, the quantities of charges stored on the calibration capacitor $C_{C1}$ and the calibration capacitor $C_{C2}$ are respectively as follows:

$$Q_{CC1,t2-t3} = Q_{CC2,t1-t2} - I_2 t_{discharge} = C_{C1} V_{DD} - \frac{I_2(V_{DD} - V_{R1})C_X}{I_1}, \quad \text{Equation (25)}$$

$$Q_{CC2,t2-t3} = I_3 t_{charge} = \frac{I_3(V_{DD} - V_{R1})C_X}{I_1}, \quad \text{Equation (26)}$$

where $t_{charge}$ shall satisfy a condition $t_{charge} \leq t3-t2$. $I_2$ is a current value of the second current source $I_2$, $I_3$ is a current value of the third current source $I_3$, and $C_{C2}$ is a capacitance value of a second calibration capacitor $C_{C2}$.

Optionally, in order to avoid charge leakage caused by frequent switching of a switch, a buffer phase may be included after the second phase (for example, t3 to t4 shown in FIG. 8). In the buffer phase, the control circuit 230 may control all the switches to remain off, and the quantity of charges on each of the capacitors remains unchanged.

In the third phase (for example, a phase t4 to t5 shown in FIG. 8), the control circuit 230 controls the switches S7 and S8 to be turned on, and the switches S1~S6, S11 and S12 to be turned off. Thus, the first integrating circuit 212 converts the capacitance signal of the first calibration capacitor $C_{C1}$ into the first voltage signal $V_{OUTP}$, and the second integrating circuit 222 converts the capacitance signal of the second calibration capacitor $C_{C2}$ into the second voltage signal $V_{OUTN}$. And the input voltage of the second input end of the first integrating circuit 212 is equal to the first voltage $V_{R1}$, and the input voltage of the second input end of the second integrating circuit 222 is equal to the second voltage $V_{R2}$.

Specifically, after S7 and S8 are turned on, the first integrating circuit 212 and the second integrating circuit 222 start to perform integration operations. Due to a virtual short characteristic of the first operational amplifier OP1, voltages of an upper electrode plate of the first calibration capacitor $C_{C1}$ and a left electrode plate of the first integrating capacitor are clamped to the voltage $V_{R1}$. Due to a virtual off characteristic of the first operational amplifier OP1, the charges stored on the first calibration capacitor $C_{C1}$ at time t4 will be redistributed on the first calibration capacitor $C_{C1}$ and the first integrating capacitor $C_{S1}$. A charge balance equation is:

$$C_{C1} V_{DD} - \frac{I_2(V_{DD} - V_{R1})C_X}{I_1} = V_{R1} C_{C1} + (V_{R1} - V_{OUTP})C_{S1}, \quad \text{Equation (27)}$$

where $C_{S1}$ is a capacitance value of the first integrating capacitor $C_{S1}$.

The first voltage signal $V_{OUTP}$ output by the first integrating circuit 212 can be calculated by Equation (27) as follows:

$$V_{OUTP} = V_{R1} - \frac{C_{C1} - C_X I_2 / I_1}{C_{S1}}(V_{DD} - V_{R1}). \quad \text{Equation (28)}$$

Due to a virtual short characteristic of the second operational amplifier OP2, voltages of an upper electrode plate of the second calibration capacitor $C_{C2}$ and a left electrode plate of the second integrating capacitor $C_{S2}$ are clamped to the second voltage $V_{R2}$. Due to a virtual off characteristic of the second operational amplifier OP2, the charges stored on the second calibration capacitor $C_{C2}$ at time t3 will be redistributed on the second calibration capacitor $C_{C2}$ and the second integrating capacitor $C_{S2}$. A charge balance equation is:

$$\frac{I_3(V_{DD} - V_{R1})C_X}{I_1} = V_{R2}C_{C2} + (V_{R2} - V_{OUTN})C_{S2}, \quad \text{Equation (29)}$$

where $C_{S2}$ is a capacitance value of the second integrating capacitor $C_{S2}$.

The second voltage signal $V_{OUTN}$ output by the second integrating circuit 222 can be calculated by Equation (29) as follows:

$$V_{OUTN} = V_{R2} + \frac{V_{R2}C_{C2} - (V_{DD} - V_{R1})C_X I_3 / I_1}{C_{S2}}. \quad \text{Equation (30)}$$

Optionally, in order to avoid charge leakage caused by frequent switching of a switch, a buffer phase may be further included after the third phase (for example, t5 to t6 shown in FIG. 8). In the buffer phase, the control circuit 230 may control all the switches to remain off, and the first voltage signal $V_{OUTP}$ output by the first integrating circuit 212 and the second voltage signal $V_{OUTN}$ remain unchanged.

Similarly, for the detection capacitor $C_X$, a process from the first phase to the third phase may be repeatedly executed for N times, that is, a time period t1 to t6 in FIG. 8 are repeated for N times to enhance sensitivity of capacitance detection. FIG. 8 shows only the case of N=2. After the above process is repeatedly executed for N times, the first voltage signal $V_{OUTP}$ output by the first integrating circuit 212 and the second voltage signal $V_{OUTN}$ output by the second integrating circuit 222 are respectively as follows:

$$V_{OUTP} = V_{R1} - \frac{C_{C1} - C_X I_2 / I_1}{C_{S1}}(V_{DD} - V_{R1})N, \quad \text{Equation (31)}$$

$$V_{OUTN} = V_{R2} + \frac{V_{R2}C_{C2} - (V_{DD} - V_{R1})C_X I_3 / I_1}{C_{S2}}N, \quad \text{Equation (32)}$$

where, optionally $C_{C1} = C_X I_2 / I_1$, that is, $C_{C1} - C_X I_2 / I_1 = 0$ and $C_{C2} = C_X I_3 / I_1$, that is, $C_{C2} - C_X I_3 / I_1 = 0$.

Optionally, $V_{R1} = V_{R2} = V_{DD/2} = V_{CM}$.

When a capacitance sensor is not operated, a capacitance value of the detection capacitor $C_X$ is equal to the base capacitance value $C_{X0}$, the first voltage signal output by the first integrating circuit 212 and the second voltage signal output by the second integrating circuit 222 satisfy $V_{OUTP} = V_{OUTN} = V_{CM}$, and at this time, a differential operation is performed on the first voltage signal $V_{OUTP}$ output by the first integrating circuit 212 and the second voltage signal $V_{OUTN}$ output by the second integrating circuit 222 to obtain a first differential signal.

When the sensor is operated, for example, a user touches a touch point corresponding to the detection capacitor, a capacitance value of the detection capacitor $C_X$ is changed from the base capacitance value $C_{x0}$ to $C_{x0}+\Delta C_x$, and according to Equations (31) and (32), the first voltage signal $V_{OUTP}$ output by the first integrating circuit 212 and the second voltage signal $V_{OUTN}$ output by the second integrating circuit 222 can be respectively obtained as follows:

$$V_{OUTP} = V_{CM} + \frac{\Delta C_X I_2 / I_1}{C_{S1}} V_{CM} N, \quad \text{Equation (33)}$$

$$V_{OUTN} = V_{CM} - \frac{\Delta C_X I_3 / I_1}{C_{S2}} V_{CM} N. \quad \text{Equation (34)}$$

The processing circuit 240 may perform differential processing on the first voltage signal $V_{OUTP}$ and the second voltage signal $V_{OUTN}$ based on Equations (33) and (34) to obtain a second differential signal, and the capacitance variation $\Delta C_x$ of the detection capacitor $C_X$ may be determined according to the first differential signal and the second differential signal. In particular, when $V_{OUTP} = V_{OUTN} = V_{CM}$, the first differential signal is zero, and therefore the second differential signal can directly reflect the capacitance variation $\Delta C_x$, that is, the capacitance variation $\Delta C_x$ can be directly obtained according to the second differential signal without taking the first differential signal into account.

In each of the phases of type 1 and type 2, the capacitance detecting circuit performs different operations. The foregoing divisions of different phases are merely examples, and there are also other divisions according to operations performed by the capacitance detecting circuit in different phases.

Taking division of an initialization phase as an example, an initialization phase, a first phase, a second phase and a third phase are included in type 2, and charges on two integrating circuits need to be cleared in the initialization phase of type 2; an initialization phase, a first phase, a second phase, a third phase and a fourth phase are included in type 1, and charges on two integrating circuits are not only needed to be cleared, but also the first calibration capacitor $C_{C1}$ and the detection capacitor $C_X$ are needed to be completely discharged in the initialization phase of type 1, so that the first current source $I_1$ and the second current source $I_2$ respectively charge the detection capacitor $C_X$ and the first calibration capacitor $C_{C1}$ for the same duration in the first phase until the voltage of the detection capacitor $C_X$ reaches the first voltage $V_{R1}$ from zero. In the fourth phase of type 1, after the two integrating circuits perform integration operations, the first calibration capacitor $C_{C1}$ and the detection capacitor $C_X$ need to be completely discharged, so that the first current source $I_1$ and the second current source $I_2$ charge the detection capacitor $C_X$ and the first calibration capacitor $C_{C1}$ for the same duration in the following first phase until the voltage of the detection capacitor $C_X$ reaches the first voltage $V_{R1}$ from zero.

If the process of completely discharging the detection capacitor $C_X$ and the first calibration capacitor $C_{C1}$ in the fourth phase of type 1 is classified into the first phase, only the process of clearing the charges on the two integrating circuits is needed to be included in the initialization phase of type 1.

Or alternatively, if the process of completely discharging the detection capacitor $C_X$ and the first calibration capacitor $C_{C1}$ in the first phase of type 2 is classified into the third phase, that is, after two integrators perform integration operations in the third phase, the detection capacitor $C_X$ and the first calibration capacitor $C_{C1}$ are further completely discharged. It not only needs to clear the charges on the two integrating circuits, but also to discharge the detection capacitor $C_X$ and the first calibration capacitor $C_{C1}$ completely in the initialization phase of type 2.

Figure 9:
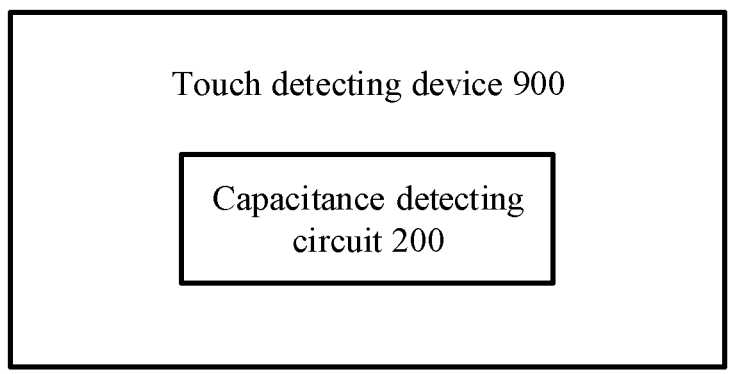
FIG. 9 is a schematic circuit diagram of a touch detecting device according to an embodiment of the present application.

FIG. 9 is a schematic circuit diagram of a touch detecting device 900 according to an embodiment of the present application.

As shown in FIG. 9, the touch detecting device 900 includes the capacitance detecting circuit 200 as shown in FIG. 2. The touch detecting device 900 determines a touch position of a user according to a capacitance variation of a detection capacitor with respect to a base capacitance value that is determined by the capacitance detecting circuit.

Optionally, the detection capacitor is a capacitor formed by an electrode of a touch channel and ground.

Optionally, an embodiment of the present application provides a terminal device, including the touch detecting device 900 as shown in FIG. 9. By way of example and not limitation, the terminal device 900 may be a mobile phone, a tablet computer, a notebook computer, a desktop computer, an in-vehicle electronic device, a wearable smart device, or the like.

Described above are the specific embodiments of the present application only, but the protection scope of the present application is not limited to this, those skilled who are familiar with the art could readily think of variations or substitutions within the technical scope disclosed by the present application, and these variations or substitutions shall fall within the protection scope of the present application. Therefore, the protection scope of the claims should prevail over the protection scope of the present application.

What is claimed is:

1. A capacitance detecting circuit, configured to detect a capacitance variation of a detection capacitor with respect to a base capacitance value of the detection capacitor, comprising:
   a first front end circuit;
   a second front end circuit;
   a control circuit, configured to control the first front end circuit and the second front end circuit such that the first front end circuit is configured to convert a capacitance signal of the detection capacitor into a first voltage signal under control of the control circuit, and the second front end circuit is configured to convert a capacitance signal of the detection capacitor into a second voltage signal under control of the control circuit; and
   a processing circuit;
   wherein the first front end circuit comprises a first calibration capacitor, a first charging and discharging circuit and a first integrating circuit, the detection capacitor is connected to the first charging and discharging circuit, and the first calibration capacitor is connected to the first charging and discharging circuit and a first input end of the first integrating circuit;
   the first charging and discharging circuit is configured to perform charging and discharging on the detection capacitor connected to the first front end circuit and the first calibration capacitor, and the first integrating circuit is configured to convert the capacitance signal of the detection capacitor into the first voltage signal through the first calibration capacitor;
   the second front end circuit comprises a second calibration capacitor, a second charging and discharging circuit and a second integrating circuit, and the second calibration capacitor is connected to the second charging and discharging circuit and a first input end of the second integrating circuit;
   the second charging and discharging circuit is configured to perform charging and discharging on the second calibration capacitor, and the second integrating circuit is configured to convert the capacitance signal of the detection capacitor into the second voltage signal through the second calibration capacitor; and
   the processing circuit is connected to output ends of the first integrating circuit and the second integrating circuit, and configured to calculate a differential signal of the first voltage signal output by the first integrating circuit and the second voltage signal output by the second integrating circuit, and determine the capacitance variation of the detection capacitor with respect to the base capacitance value according to the differential signal;
   wherein when the first charging and discharging circuit comprises a first current source and a second current source, and the second charging and discharging circuit comprises a third current source, the first current source is connected to the detection capacitor for preforming charging or discharging on the detection capacitor, and the second current source is connected to the first calibration capacitor for performing charging or discharging on the first calibration capacitor, and a ratio of a capacitance value of the first calibration capacitor to the base capacitance value is equal to a ratio of a current value of the second current source to a current value of the first current source, and the third current source is connected to the second calibration capacitor for performing charging or discharging on the second calibration capacitor, and a ratio of a capacitance value of the second calibration capacitor to the base capacitance value is equal to a ratio of a current value of the third current source to the current value of the first current source;
   wherein when the first charging and discharging circuit comprises a first current source, a second current source and a fourth current source, and the second charging and discharging circuit comprises a third current source, the first current source and the fourth current source are both connected to the detection capacitor, the first current source is configured to charge the detection capacitor, and the fourth current source is configured to discharge the detection capacitor, the second current source is connected to the first calibration capacitor for charging the first calibration capacitor, and a ratio of a capacitance value of the first calibration capacitor to the base capacitance value is equal to a ratio of a current value of the second current source to a current value of the first current source, and the third current source is connected to the second calibration capacitor for discharging the second calibration capacitor, and a ratio of a capacitance value of the second calibration capacitor to the base capacitance value is equal to a ratio of a current value of the third current source to a current value of the fourth current source.

2. The capacitance detecting circuit according to claim 1, wherein when the first charging and discharging circuit comprises a first current source and a second current source, and the second charging and discharging circuit comprises a third current source,
- in an initialization phase, the control circuit is configured to control charges on the first integrating circuit and the second integrating circuit to be cleared;
- in a first phase, the first charging and discharging circuit is configured to discharge the detection capacitor until a voltage of the detection capacitor is equal to zero, and discharge the first calibration capacitor until a voltage of the first calibration capacitor is equal to zero, and the second charging and discharging circuit is configured to charge the second calibration capacitor until a voltage of the second calibration capacitor is equal to a power supply voltage;
- in a second phase, the first current source is configured to charge the detection capacitor until a voltage of the detection capacitor reaches a first voltage, the second current source is configured to charge the first calibration capacitor in a time period during which the first current source charges the detection capacitor, and the third current source is configured to discharge the second calibration capacitor to the third current source in a time period during which the first current source charges the detection capacitor;
- in a third phase, the first integrating circuit is configured to convert a capacitance signal of the first calibration capacitor into the first voltage signal, and the second integrating circuit is configured to convert a capacitance signal of the second calibration capacitor into the second voltage signal, wherein an input voltage of a second input end of the first integrating circuit is equal to the first voltage, and an input voltage of a second input end of the second integrating circuit is equal to a second voltage.

3. The capacitance detecting circuit according to claim 2, wherein the first charging and discharging circuit comprises a first switch, a second switch, a third switch and a fourth switch, the second charging and discharging circuit comprises a fifth switch and a sixth switch, the first integrating circuit comprises a seventh switch, and the second integrating circuit comprises an eighth switch,
- wherein one end of the first switch is grounded and the other end is connected to a first end of the detection capacitor; one end of the second switch is connected to the first current source and the other end is connected to the first end of the detection capacitor; one end of the third switch is connected to the second current source and the other end is connected to a first end of the first calibration capacitor; one end of the fourth switch is grounded and the other end is connected to the first end of the first calibration capacitor; one end of the fifth switch is connected to a first end of the second calibration capacitor and the other end is connected to the third current source; one end of the sixth switch is connected to a power supply and the other end is connected to the first end of the second calibration capacitor; one end of the seventh switch is connected to the first end of the first calibration capacitor and the other end is connected to the first input end of the first integrating circuit; one end of the eighth switch is connected to the first end of the second calibration capacitor and the other end is connected to the first input end of the second integrating circuit; and a second end of the detection capacitor, a second end of the first calibration capacitor and a second end of the second calibration capacitor are all grounded.

4. The capacitance detecting circuit according to claim 3, wherein:
- in the first phase, the first switch, the fourth switch and the sixth switch are turned on, and the second switch, the third switch, the fifth switch, the seventh switch and the eighth switch are turned off,
- in the second phase, the second switch, the third switch and the fifth switch are turned on, and the first switch, the fourth switch, the sixth switch, the seventh switch and the eighth switch are turned off, and
- in the third phase, the seventh switch and the eighth switch are turned on, and the first switch, the second switch, the third switch, the fourth switch, the fifth switch and the sixth switch are turned off.

5. The capacitance detecting circuit according to claim 2, wherein the first voltage signal $V_{OUTP}$ output by the first integrating circuit and the second voltage signal $V_{OUTN}$ output by the second integrating circuit are respectively:

$$V_{OUTP} = V_{CM} - \frac{\Delta Cx(I_2/I_1)}{C_{S1}} V_{CM} N,$$

$$V_{OUTN} = V_{CM} + \frac{\Delta Cx(I_3/I_1)}{C_{S2}} V_{CM} N,$$

wherein $V_{R1}=V_{R2}=V_{DD}/2=V_{CM}$, $V_{R1}$ is a voltage value of the first voltage, $V_{R2}$ is a voltage value of the second voltage, $I_1$ is a current value of the first current source, $I_2$ is a current value of the second current source, $I_3$ is a current value of the third current source, $C_{S1}$ is a capacitance value of a first integrating capacitor, $C_{S2}$ is a capacitance value of a second integrating capacitor, $\Delta Cx$ is a capacitance variation of a capacitance value of the detection capacitor with respect to the base capacitance value, $V_{DD}$ is a power supply voltage, and N is a number of execution times from the first phase to the third phase, where N is a positive integer.

6. The capacitance detecting circuit according to claim 1, wherein when the first charging and discharging circuit comprises a first current source, a second current source and a fourth current source, and the second charging and discharging circuit comprises a third current source,
- in an initialization phase, the control circuit is configured to control charges on the first integrating circuit and the second integrating circuit to be cleared;
- in a first phase, the first charging and discharging circuit is configured to charge the detection capacitor until a voltage of the detection capacitor is equal to a power supply voltage, and to charge the first calibration capacitor until a voltage of the first calibration capacitor is equal to the power supply voltage, and the second charging and discharging circuit is configured to discharge the second calibration capacitor until a voltage of the second calibration capacitor is equal to zero;
- in a second phase, the first current source is configured to discharge the detection capacitor to the first current source until a voltage of the detection capacitor reaches a first voltage, the second current source is configured to discharge the first calibration capacitor to the second current source in a time period during which the detection capacitor discharges to the first current source, and the third current source is configured to charge the second calibration capacitor in a time period during which the detection capacitor discharges to the first current source; and in a third phase, the first integrating circuit is configured to convert a capacitance signal of the first calibration capacitor into the first voltage signal, and the second integrating circuit is configured to convert a capacitance signal of the second calibration capacitor into the second voltage signal, wherein an input voltage of a second input end of the first integrating circuit is equal to the first voltage, and an input voltage of a second input end of the second integrating circuit is equal to a second voltage.

7. The capacitance detecting circuit according to claim 6, wherein:

the first charging and discharging circuit comprises a first switch, a second switch, a third switch and a fourth switch, the second charging and discharging circuit comprises a fifth switch and a sixth switch, the first integrating circuit comprises a seventh switch, and the second integrating circuit comprises an eighth switch, wherein one end of the first switch is connected to a power supply and the other end is connected to a first end of the detection capacitor; one end of the second switch is connected to the first current source and the other end is connected to the first end of the detection capacitor; one end of the third switch is connected to the second current source and the other end is connected to a first end of the first calibration capacitor; one end of the fourth switch is connected to a power supply and the other end is connected to the first end of the first calibration capacitor; one end of the fifth switch is connected to a first end of the second calibration capacitor and the other end is connected to the third current source; one end of the sixth switch is grounded and the other end is connected to the first end of the second calibration capacitor; one end of the seventh switch is connected to the first end of the first calibration capacitor and the other end is connected to the first input end of the first integrating circuit; one end of the eighth switch is connected to the first end of the second calibration capacitor and the other end is connected to the first input end of the second integrating circuit; and a second end of the detection capacitor, a second end of the first calibration capacitor and a second end of the second calibration capacitor are all grounded.

8. The capacitance detecting circuit according to claim 7, wherein:

in the first phase, the first switch, the fourth switch and the sixth switch are turned on, and the second switch, the third switch, the fifth switch, the seventh switch and the eighth switch are turned off, in the second phase, the second switch, the third switch and the fifth switch are turned on, and the first switch, the fourth switch, the sixth switch, the seventh switch and the eighth switch are turned off, and in the third phase, the seventh switch and the eighth switch are turned on, and the first switch, the second switch, the third switch, the fourth switch, the fifth switch and the sixth switch are turned off.

9. The capacitance detecting circuit according to claim 6, wherein the first voltage signal $V_{OUTP}$ output by the first integrating circuit and the second voltage signal $V_{OUTN}$ output by the second integrating circuit are respectively:

$$V_{OUTP} = V_{CM} + \frac{\Delta C x (I_2/I_1)}{C_{S1}} V_{CM} N,$$

$$V_{OUTN} = V_{CM} - \frac{\Delta C x (I_3/I_1)}{C_{S2}} V_{CM} N,$$

wherein $V_{R1}=V_{R2}=V_{DD}/2=V_{CM}$, $V_{R1}$ is a voltage value of the first voltage, $V_{R2}$ is a voltage value of the second voltage, $I_1$ is a current value of the first current source, $I_2$ is a current value of the second current source, $I_3$ is a current value of the third current source, $C_{S1}$ is a capacitance value of a first integrating capacitor, $C_{S2}$ is a capacitance value of a second integrating capacitor, $\Delta Cx$ is a capacitance variation of a capacitance value of the detection capacitor with respect to the base capacitance value, $V_{DD}$ is a power supply voltage, and N is a number of execution times from the first phase to the third phase, where N is a positive integer.

10. The capacitance detecting circuit according to claim 9, wherein the capacitance detecting circuit further comprises a comparator, a first input end of the comparator is connected to the detection capacitor, an output end of the comparator is connected to the control circuit, and a second input end of the comparator is configured to input the first voltage in the second phase, and when the comparator determines that the voltage of the detection capacitor reaches the first voltage in the second phase, the control circuit controls the first charging and discharging circuit to stop performing charging and discharging on the detection capacitor and the first calibration capacitor and controls the second charging and discharging circuit to stop performing charging and discharging on the second calibration capacitor.

11. The capacitance detecting circuit according to claim 1, wherein:

in an initialization phase, the control circuit is configured to control charges on the first integrating circuit and the second integrating circuit to be cleared, and the first charging and discharging circuit is configured to clear charges on the first calibration capacitor and the detection capacitor;

in a first phase, the first current source is configured to charge the detection capacitor until a voltage of the detection capacitor reaches a first voltage, and the second current source is configured to charge the first calibration capacitor in a time period during which the first current source charges the detection capacitor;

in a second phase, the first integrating circuit is configured to convert a capacitance signal of the first calibration capacitor into the first voltage signal, the first charging and discharging circuit is configured to charge the detection capacitor until a voltage of the detection capacitor is equal to a power supply voltage, and the second charging and discharging circuit is configured to charge the second calibration capacitor until a voltage of the second calibration capacitor is equal to a power supply voltage, wherein an input voltage of a second input end of the first integrating circuit is equal to the first voltage;

in a third phase, the fourth current source is configured to discharge the detection capacitor to the fourth current source until a voltage of the detection capacitor reaches a second voltage, and the third current source is configured to discharge the second calibration capacitor to the third current source in a time period during which the detection capacitor discharges to the fourth current source; and in a fourth phase, the second integrating circuit is configured to convert a capacitance signal of the second calibration capacitor into the second voltage signal, and the first charging and discharging circuit is configured to discharge the detection capacitor until a voltage of the detection capacitor is equal to zero, and discharge the first calibration capacitor until a voltage of the first calibration capacitor is equal to zero, wherein an input voltage of a second input end of the second integrating circuit is equal to the second voltage.

12. The capacitance detecting circuit according to claim 11, wherein:

the first charging and discharging circuit comprises a first switch, a second switch, a third switch, a fourth switch, a ninth switch and a tenth switch, the second charging and discharging circuit comprises a fifth switch and a sixth switch, the first integrating circuit comprises a seventh switch, and the second integrating circuit comprises an eighth switch, wherein one end of the first switch is grounded and the other end is connected to a first end of the detection capacitor; one end of the second switch is connected to the first current source and the other end is connected to the first end of the detection capacitor; one end of the third switch is connected to the second current source and the other end is connected to a first end of the first calibration capacitor; one end of the fourth switch is grounded and the other end is connected to the first end of the first calibration capacitor; one end of the ninth switch is connected to the fourth current source and the other end is connected to the first end of the detection capacitor; one end of the tenth switch is connected to a power supply and the other end is connected to the first end of the detection capacitor; one end of the fifth switch is connected to a first end of the second calibration capacitor and the other end is connected to the third current source; one end of the sixth switch is connected to a power supply and the other end is connected to the first end of the second calibration capacitor; one end of the seventh switch is connected to the first end of the first calibration capacitor and the other end is connected to the first input end of the first integrating circuit; one end of the eighth switch is connected to the first end of the second calibration capacitor and the other end is connected to the first input end of the second integrating circuit; and a second end of the detection capacitor, a second end of the first calibration capacitor and a second end of the second calibration capacitor are all grounded.

13. The capacitance detecting circuit according to claim 12, wherein:

in the first phase, the second switch and the third switch are turned on and the first switch, the fourth switch, the fifth switch, the sixth switch, the seventh switch, the eighth switch, the ninth switch and the tenth switch are turned off, in the second phase, the sixth switch, the seventh switch and the tenth switch are turned on, and the first switch, the second switch, the third switch, the fourth switch, the fifth switch, the eighth switch and the ninth switch are turned off;

in the third phase, the fifth switch and the ninth switch are turned on, and the first switch, the second switch, the third switch, the fourth switch, the sixth switch, the seventh switch, the eighth switch and the tenth switch are turned off; and in the fourth phase, the first switch, the fourth switch and the eighth switch are turned on, and the second switch, the third switch, the fifth switch, the sixth switch, the seventh switch, the ninth switch and the tenth switch are turned off.

14. The capacitance detecting circuit according to claim 11, wherein the capacitance detecting circuit further comprises a comparator, a first input end of the comparator is connected to the detection capacitor, an output end of the comparator is connected to the control circuit, and a second input end of the comparator is configured to input the first voltage in the first phase, and input the second voltage in the third phase, and when the comparator determines that the voltage of the detection capacitor reaches the first voltage in the first phase or the voltage of the detection capacitor reaches the second voltage in the third phase, the control circuit controls the first charging and discharging circuit to stop performing charging and discharging on the detection capacitor and the first calibration capacitor and controls the second charging and discharging circuit to stop performing charging and discharging on the second calibration capacitor.

15. The capacitance detecting circuit according to claim 14, wherein the first voltage signal $V_{OUTP}$ output by the first integrating circuit and the second voltage signal $V_{OUTN}$ output by the second integrating circuit are respectively:

$$V_{OUTP} = V_{R1} - \frac{\Delta Cx(I_2/I_1)}{C_{S1}} V_{R1}(N/2),$$

$$V_{OUTN} = V_{R2} + \frac{\Delta Cx(I_3/I_4)}{C_{S2}} (V_{DD} - V_{R2})(N/2),$$

wherein $V_{R1}$ is a voltage value of the first voltage, $V_{R2}$ is a voltage value of the second voltage, $V_{DD}$ is a power supply voltage, $I_1$ is a current value of the first current source, $I_2$ is a current value of the second current source, $I_3$ is a current value of the third current source, $I_4$ is a current value of the fourth current source, $C_{S1}$ is a capacitance value of a first integrating capacitor, $C_{S2}$ is a capacitance value of a second integrating capacitor, $\Delta Cx$ is a capacitance variation of a capacitance value of the detection capacitor with respect to the base capacitance value, and N is a number of execution times from the first phase to the third phase, where N is an even number.

16. The capacitance detecting circuit according to claim 1, wherein the first integrating circuit comprises a first operational amplifier and a first integrating capacitor connected in parallel with the first operational amplifier, and the second integrating circuit comprises a second operational amplifier and a second integrating capacitor connected in parallel with the second operational amplifier.

17. A touch detecting device, comprising:
a detection capacitor; and
a capacitance detecting circuit, configured to determine a touch position of a user by detecting a capacitance variation of the detection capacitor with respect to a base capacitance value of the detection capacitor, wherein the capacitance detecting circuit comprises:
a control circuit;

a first front end circuit, comprises a first calibration capacitor and a first charging and discharging circuit, and configured to convert a capacitance signal of the detection capacitor into a first voltage signal under control of the control circuit;

a second front end circuit, comprises a second calibration capacitor and a second charging and discharging circuit, and configured to convert a capacitance signal of the detection capacitor into a second voltage signal under control of the control circuit; and a processing circuit, configured to calculate a differential signal of the first voltage signal and the second voltage signal and determine the capacitance variation of the detection capacitor with respect to the base capacitance value according to the differential signal;

wherein when the first charging and discharging circuit comprises a first current source and a second current source, and the second charging and discharging circuit comprises a third current source, the first current source is connected to the detection capacitor for preforming charging or discharging on the detection capacitor, and the second current source is connected to the first calibration capacitor for performing charging or discharging on the first calibration capacitor, and a ratio of a capacitance value of the first calibration capacitor to the base capacitance value is equal to a ratio of a current value of the second current source to a current value of the first current source, and the third current source is connected to the second calibration capacitor for performing charging or discharging on the second calibration capacitor, and a ratio of a capacitance value of the second calibration capacitor to the base capacitance value is equal to a ratio of a current value of the third current source to the current value of the first current source;

wherein when the first charging and discharging circuit comprises a first current source, a second current source and a fourth current source, and the second charging and discharging circuit comprises a third current source, the first current source and the fourth current source are both connected to the detection capacitor, the first current source is configured to charge the detection capacitor, and the fourth current source is configured to discharge the detection capacitor, the second current source is connected to the first calibration capacitor for charging the first calibration capacitor, and a ratio of a capacitance value of the first calibration capacitor to the base capacitance value is equal to a ratio of a current value of the second current source to a current value of the first current source, and the third current source is connected to the second calibration capacitor for discharging the second calibration capacitor, and a ratio of a capacitance value of the second calibration capacitor to the base capacitance value is equal to a ratio of a current value of the third current source to a current value of the fourth current source.

18. The touch detecting device according to claim 17, wherein:

the first front end circuit comprises a first integrating circuit, the detection capacitor is connected to the first charging and discharging circuit, and the first calibration capacitor is connected to the first charging and discharging circuit and a first input end of the first integrating circuit, and the first integrating circuit is configured to convert the capacitance signal of the detection capacitor into the first voltage signal through the first calibration capacitor; and the second front end circuit comprises a second integrating circuit, and the second calibration capacitor is connected to the second charging and discharging circuit and a first input end of the second integrating circuit, and the second integrating circuit is configured to convert the capacitance signal of the detection capacitor into the second voltage signal through the second calibration capacitor;

the processing circuit is connected to output ends of the first integrating circuit and the second integrating circuit.

* * * * *